(12) United States Patent  (10) Patent No.: US 7,548,092 B2
Lablans                         (45) Date of Patent: Jun. 16, 2009

(54) IMPLEMENTING LOGIC FUNCTIONS WITH NON-MAGNITUDE BASED PHYSICAL PHENOMENA

(75) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 28 days.

(21) Appl. No.: 11/964,507

(22) Filed: Dec. 26, 2007

(65) Prior Publication Data

US 2008/0111583 A1    May 15, 2008

Related U.S. Application Data

(63) Continuation-in-part of application No. 11/686,542, filed on Mar. 15, 2007, now Pat. No. 7,355,444, which is a continuation of application No. 11/000,218, filed on Nov. 30, 2004, now Pat. No. 7,218,144, which is a continuation-in-part of application No. 10/935,960, filed on Sep. 8, 2004.

(60) Provisional application No. 60/954,875, filed on Aug. 9, 2007, provisional application No. 60/547,683, filed on Feb. 25, 2004.

(51) Int. Cl.
    *H03K 19/00*      (2006.01)
(52) U.S. Cl. ......................................... 326/59; 326/104
(58) Field of Classification Search ............. 326/56–60, 326/112, 119, 121
    See application file for complete search history.

(56) References Cited

U.S. PATENT DOCUMENTS

| 3,129,340 | A | 4/1964  | Baskin         |
| 3,142,037 | A | 7/1964  | Gazale         |
| 3,210,529 | A | 10/1965 | Hanson         |
| 3,283,256 | A | 11/1966 | Hurowirz       |
| 3,492,496 | A | 1/1970  | Callan         |
| 3,515,805 | A | 6/1970  | Fracassi et al.|
| 3,586,022 | A | 6/1971  | Bauer          |
| 3,649,915 | A | 3/1972  | Mildonian      |
| 3,656,117 | A | 4/1972  | Maley et al.   |
| 3,660,678 | A | 5/1972  | Maley et al.   |
| 3,663,837 | A | 5/1972  | Epstein et al. |
| 3,671,764 | A | 6/1972  | Maley et al.   |
| 3,718,863 | A | 2/1973  | Fletcher et al.|
| 3,760,277 | A | 9/1973  | Whang          |

(Continued)

OTHER PUBLICATIONS

Lablans, Peter "Multi-Valued Logic", http://web.archive.org/web/20050313212227/http://www.multivaluelogic.com/, (Mar. 2005), pp. 1-18.

(Continued)

*Primary Examiner*—Don P Le
(74) *Attorney, Agent, or Firm*—Diehl Servilla LLC; Glen M. Diehl, Esq.

(57) ABSTRACT

An n-valued switch with $n \geq 2$, with an input enabled to receive a signal in one of n states, an output enabled to provide a signal in one of at least 2 states, under control of a control signal having one of at least 2 states is disclosed. Signals are instances of a physical phenomenon, an instance representing a state. N-valued inverters are also disclosed. Different types of signals are disclosed, including optical signals with different wavelengths, electrical signals with different frequencies and signals represented by a presence of a material. A kit including an n-valued switch is also disclosed.

25 Claims, 12 Drawing Sheets

U.S. PATENT DOCUMENTS

| | | |
|---|---|---|
| 3,866,147 A | 2/1975 | De Couvreur et al. |
| 3,988,538 A | 10/1976 | Patten |
| 3,988,676 A | 10/1976 | Whang |
| 4,304,962 A | 12/1981 | Fracassi et al. |
| 4,378,595 A | 3/1983 | Current |
| 4,383,322 A | 5/1983 | Halpern et al. |
| 4,775,984 A | 10/1988 | Jaffre et al. |
| 4,808,854 A | 2/1989 | Reinagel |
| 4,815,130 A | 3/1989 | Lee |
| 4,984,192 A | 1/1991 | Flynn |
| 4,990,796 A | 2/1991 | Olson |
| 5,017,817 A | 5/1991 | Yamakawa |
| 5,230,003 A | 7/1993 | Dent et al. |
| 5,412,687 A | 5/1995 | Sutton et al. |
| 5,457,783 A | 10/1995 | Chhatwal |
| 5,563,530 A | 10/1996 | Frazier |
| 5,621,580 A | 4/1997 | Cruz et al. |
| 5,714,892 A | 2/1998 | Bowers et al. |
| 5,724,383 A | 3/1998 | Gold et al. |
| 5,745,522 A | 4/1998 | Heegard |
| 5,761,239 A | 6/1998 | Gold et al. |
| 5,790,265 A | 8/1998 | Shikakura |
| 5,790,591 A | 8/1998 | Gold et al. |
| 5,797,898 A | 8/1998 | Santini et al. |
| 5,856,980 A | 1/1999 | Doyle |
| 5,917,914 A | 6/1999 | Shaw et al. |
| 5,959,871 A | 9/1999 | Pierzchala et al. |
| 5,978,412 A | 11/1999 | Takai |
| 5,999,542 A | 12/1999 | Turner et al. |
| 6,122,376 A | 9/2000 | Rao |
| 6,133,753 A | 10/2000 | Thomson et al. |
| 6,133,754 A | 10/2000 | Olson |
| 6,192,257 B1 | 2/2001 | Ray |
| 6,288,922 B1 | 9/2001 | Wong et al. |
| 6,320,897 B1 | 11/2001 | Fattouche et al. |
| 6,452,958 B1 | 9/2002 | van Nee |
| 6,477,205 B1 | 11/2002 | Doblar et al. |
| 6,519,275 B2 | 2/2003 | Callaway et al. |
| 6,608,807 B1 | 8/2003 | Lee |
| 6,788,787 B1 | 9/2004 | Shono et al. |
| 6,824,669 B1 | 11/2004 | Li et al. |
| 6,953,656 B2 | 10/2005 | Jacobson et al. |
| 7,104,517 B1 | 9/2006 | Derand et al. |
| 7,218,144 B2 | 5/2007 | Lablans |
| 2002/0089364 A1 | 7/2002 | Goldgeisser et al. |
| 2003/063677 A1 | 4/2003 | Mix et al. |
| 2003/0072449 A1 | 4/2003 | Myszne |
| 2003/0093713 A1 | 5/2003 | Werner et al. |
| 2003/0099359 A1 | 5/2003 | Hui |
| 2003/0165184 A1 | 9/2003 | Welborn et al. |
| 2004/0021829 A1 | 2/2004 | Griffin |
| 2004/0032918 A1 | 2/2004 | Shor et al. |
| 2004/0032949 A1 | 2/2004 | Forest |
| 2004/0037108 A1 | 2/2004 | Notani |
| 2004/0042702 A1 | 3/2004 | Akimoto |
| 2004/0054703 A1 | 3/2004 | Huber et al. |
| 2004/0068164 A1 | 4/2004 | Diab et al. |
| 2004/0078576 A1 | 4/2004 | Geitinger |
| 2004/0085937 A1 | 5/2004 | Noda |
| 2004/0091106 A1 | 5/2004 | Moore et al. |
| 2005/0185796 A1 | 8/2005 | Lablans |
| 2006/0051838 A1 | 3/2006 | Hwa et al. |
| 2006/0082386 A1 | 4/2006 | Katrak et al. |
| 2006/0281121 A1 | 12/2006 | Unger et al. |
| 2007/0152710 A1 | 7/2007 | Lablans |

OTHER PUBLICATIONS

Lablans, Peter "Multi-Valued Logic", http://web.archive.org/web/20050205100106/http://www.multivaluelogic.com/, (Feb. 2005), pp. 1-26.

IMPLEMENTING LOGIC FUNCTIONS WITH NON-MAGNITUDE BASED PHYSICAL PHENOMENA

STATEMENT OF RELATED CASES

This application is a continuation-in-part of U.S. patent application Ser. No. 11/686,542 filed on Mar. 15, 2007, which is a continuation of U.S. patent application Ser. No. 11/000,218, filed on Nov. 30, 2004, entitled SINGLE AND COMPOSITE BINARY AND MULTI-VALUED LOGIC FUNCTIONS FROM GATES AND INVERTERS now U.S. Pat. No. 7,218,144 issued on May 17, 2007, which is a continuation-in-part of U.S. patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS, which are all hereby incorporated herein by reference in their entirety, and which claim priority to U.S. Provisional Patent Application No. 60/547,683, filed Feb. 25, 2004, which is also incorporated herein by reference. Furthermore this application claims the benefit of U.S. Provisional Patent Application No. 60/954,875 filed on Aug. 9, 2007 which is incorporated herein by reference.

BACKGROUND OF THE INVENTION

This invention relates to the implementation of logic or switching functions by non-magnitude based physical phenomena. More specifically it provides novel methods and apparatus to implement a logic state by using a characteristic of a physical phenomenon that is not based on a magnitude or amplitude of a signal.

Binary logic or binary switching is currently mainly provided in electronic circuits. The signals representing the states in binary logic are usually magnitude based. Binary logic or switching of course has 2 states, which are usually called 0 and 1. The two states are usually represented by a magnitude of an electric signal, either as a voltage or as a current. Sometimes a magnitude is a phase of a signal. For storage also the magnitude of a charge is used. For binary logic one of the states, but usually the 0, is represented as ground or absence of signal. A 1 can be represented as for instance 1.5 Volt or 0.5 Volt or whatever voltage is convenient. The representation of a state by a voltage is not really required, but is commonly used. The 0 can be represented by another voltage. Sometimes the opposite voltage of the one selected for 1 is used for 0; for instance −1.5 Volt. However often 0 Volt or ground or absence of signal is selected as representing a 0 state.

It should be clear that in the binary case the magnitude of the electrical signal determines the state it represents. Use of representing a signal with a certain frequency as a state is also known. For instance Frequency Shift Keying (FSK) uses 2 frequencies representing 0s and 1s in transmission systems.

One also applies Multiple Frequency-Shift Keying (MFSK) in state representation for transmission purposes, representing each of different and more than 2 states by a frequency. The advantage herein is that one has to detect the presence or absence of a signal to determine a state. The use of magnitude based signals, such as voltage based representation has an inherent problem with noise. In detection of an $m^{th}$ voltage level one can be off by for instance one level. Thus one may for instance detect state (m−1) or state (m+1) instead of m. Accordingly when a state is 'sandwiched' between two other states, potential errors are more likely.

This aspect is well known in for instance transmission theory. One may address this problem in optimizing the 'eye' of the signal and optimizing the moment of the detection of the presence of a signal level.

Applying detecting a presence or an absence of one of n signals appears to be more robust than detecting one of n levels. One actually buys better performance by using more resources for detection and by using more bandwidth.

In general it is more robust to detect a state of a phenomenon by detecting the presence or absence of the phenomenon rather than one of more than several magnitudes of the same phenomenon. In fact one may say that the problem is reduced to a plurality of binary detections. However, while multi-valued logic signals implemented by non-magnitude based physical phenomena are more robust than magnitude based representations, the implementation of logic functions wherein logic states are represented by non-magnitude based phenomena are currently unknown.

Accordingly novel and improved methods and apparatus for implementing binary and multi-valued logic or multi-state switching functions and signals by non-magnitude based physical phenomena are required.

SUMMARY OF THE INVENTION

In view of the more limited possibilities of the prior art in creating binary and n-valued logic functions novel and improved apparatus methods to create logic circuitry is required.

The general purpose of the present invention, which will be described subsequently in greater detail, is to provide novel methods and apparatus which can be applied in the creation of binary and multi-valued circuitry. Individual symbols may be represented by a signal characterized by an independent instance of a physical phenomenon. Signals can be of an electrical or optical nature, they may also be of a magnetic, quantum-mechanical or any other physical phenomenon, including a combination of phenomena; they may be of any valid distinguishable physical phenomenon, including by the presence or absence of a material such as a bio-chemical material.

Before explaining at least one embodiment of the invention in detail, it is to be understood that the invention is not limited in its application to the details of construction and to the arrangements of the components or methods as set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

Binary in the context of this application means 2-valued or 2-state. Multi-valued, n-valued or n-state in the context of this invention means an integer greater than 2. It is also to be understood that the value of a state is to indicate as difference with another state. Value in this context unless specifically stated means a state, not a real value. Accordingly an n-state signal means a signal having one of n states. A signal represents an n-state symbol, and is assumed to be a single element, mark or phenomenon. It is known in the art that a single n-state symbol can be represented by a plurality of p-state symbols. Usually in those cases n-state means radix-n which has a value. However assigning a value is not required.

One object of the present invention is to provide new apparatus to implement a logic circuit which can process a signal representing a symbol with a logic state.

In accordance with an aspect of the present invention an n-valued switch with n≧2 is provided, comprising a first input enabled to receive a first signal representing a first of n states, the signal being an independent instance of a characteristic of a first physical phenomenon, a second input enabled to receive a second signal representing a second of n states, the second signal being an independent instance of a characteristic of a second physical phenomenon, and an output enabled to provide an output signal representing a state whenever the first input receives the first signal and the second input receives the second signal.

In accordance with another aspect of the present invention an n-valued switch is provided, wherein the state of the output signal is represented by an independent instance of a characteristic of a third physical phenomenon.

In accordance with a further aspect of the present invention an n-valued switch is provided, wherein n>2.

In accordance with another aspect of the present invention an n-valued switch is provided wherein, an absence of a signal represents not a state.

In accordance with a further aspect of the present invention an n-valued switch is provided, wherein the first, the second and the third physical phenomenon are the same physical phenomenon.

In accordance with another aspect of the present invention an n-valued switch is provided, wherein the first, the second and the third physical phenomenon are not all the same physical phenomenon.

In accordance with a further aspect of the present invention an n-valued switch is provided, wherein the output provides an output signal representing the state of the input signal when the second signal represents a first state.

In accordance with another aspect of the present invention an n-valued switch is provided, wherein the output provides no signal when the second signal does not represent a first state.

In accordance with a further aspect of the present invention an n-valued switch is provided, wherein the output provides an output signal representing the state of the input signal whenever the second signal represents not a first state.

In accordance with another aspect of the present invention an n-valued switch is provided, further comprising an additional input enabled to receive a third signal representing a third of n states, the third signal being an independent instance of a characteristic of a physical phenomenon and the output being enabled to provide an output signal representing a state whenever the first input receives the first signal, the second input receives the second signal, and the additional input receives the third signal.

In accordance with a further aspect of the present invention an n-valued switch is provided, wherein the n-state switch is connected to an n-state inverter having an input and an output.

In accordance with another aspect of the present invention an n-valued switch is provided, wherein the n-state inverter includes a detector for a first signal on the input and a generator for a second signal on the output.

In accordance with a further aspect of the present invention an n-valued switch is provided, wherein the switch is part of a device which implements an n-valued logic function.

In accordance with another aspect of the present invention an n-valued switch is provided, wherein a state is represented by a wavelength of a signal.

In accordance with a further aspect of the present invention an n-valued switch is provided, wherein a state is represented by a presence of a material.

In accordance with another aspect of the present invention an n-valued switch is provided, wherein a state is represented by a material from a group consisting of a cell, a virus, an antibody, a chemical, a protein, a peptide, a nucleic acid, an oligosaccharides, a nucleotide, a metabolite, an ion, a carbohydrate, a polysaccharide, a hormone, an antigen, an enzyme, an RNA or a DNA molecule.

In accordance with a further aspect of the present invention an n-valued switch is provided, wherein the n-state switch is part of a computing device.

In accordance with another aspect of the present invention an n-valued switch is provided, wherein the n-state switch is part of a kit.

In accordance with a further aspect of the present invention a kit is provided for implementing an n-state logic device with n≧2, comprising a switch, the switch including a first input enabled to receive a first input signal having one of n states, a state being represented by an independent instance of a characteristic of a first physical phenomenon, a second input enabled to receive a second signal having one of at least two states, a state being represented by an independent instance of a characteristic of a second physical phenomenon, and an output enabled to provide an output signal representing the first input signal whenever the second signal has a first state.

In accordance with another aspect of the present invention a kit is provided for implementing an n-state logic device with n≧2, wherein n>2.

In accordance with a further aspect of the present invention a kit is provided for implementing an n-state logic device with n≧2, wherein the first and the second signal are optical signals.

In accordance with another aspect of the present invention a kit is provided for implementing an n-state logic device with n≧2, further comprising an inverter with an input and an output, including a detector for detecting a first signal on the input and a generator for generating a second signal on the output.

In accordance with a further aspect of the present invention a kit is provided for implementing an n-state logic device with n≧2, further comprising a manual.

In accordance with another aspect of the present invention a kit is provided for implementing an n-state logic device with n≧2, wherein the kit implements an n-valued logic function.

In accordance with a further aspect of the present invention a kit for implementing an n-valued logic device with n≧2 is provided, further comprising a source capable of generating a signal representing a state.

In accordance with another aspect of the present invention a kit for implementing an n-valued logic device with n≧2 is provided, further comprising an inverter with an input and an output.

In accordance with a further aspect of the present invention a kit for implementing an n-valued logic device with n≧2 is provided, further comprising a display.

In accordance with another aspect of the present invention a kit for implementing an n-valued logic device with n≧2 is provided, comprising a signal splitter. In accordance with another aspect of the present invention a kit for implementing an n-valued logic device with n≧2 is provided, further comprising a connector.

In accordance with a further aspect of the present invention a kit for implementing an n-valued logic device with n≧2 is provided, comprising a manual.

In accordance with another aspect of the present invention a kit for implementing an n-valued logic device with n≧2 is provided.

In accordance with a further aspect of the present invention an n-state switch with n≧2 is provided, comprising a first input enabled to receive a first signal being an independent instance of a characteristic of a first physical phenomenon and representing one of n states, a second input enabled to receive a second signal, the second signal being an independent instance of a characteristic of a second physical phenomenon and representing one of n states, and an output enabled to provide an output signal representing the first signal whenever the first input receives the first signal and the second input receives the second signal being in a first of n states.

In accordance with another aspect of the present invention an n-state switch is provided, wherein the first and the second physical phenomenon are identical.

BRIEF DESCRIPTION OF THE DRAWINGS

Various other objects, features and attendant advantages of the present invention will become fully appreciated as the same becomes better understood when considered in conjunction with the accompanying drawings, and wherein.

DETAILED DESCRIPTION OF THE INVENTION

Figure 1:
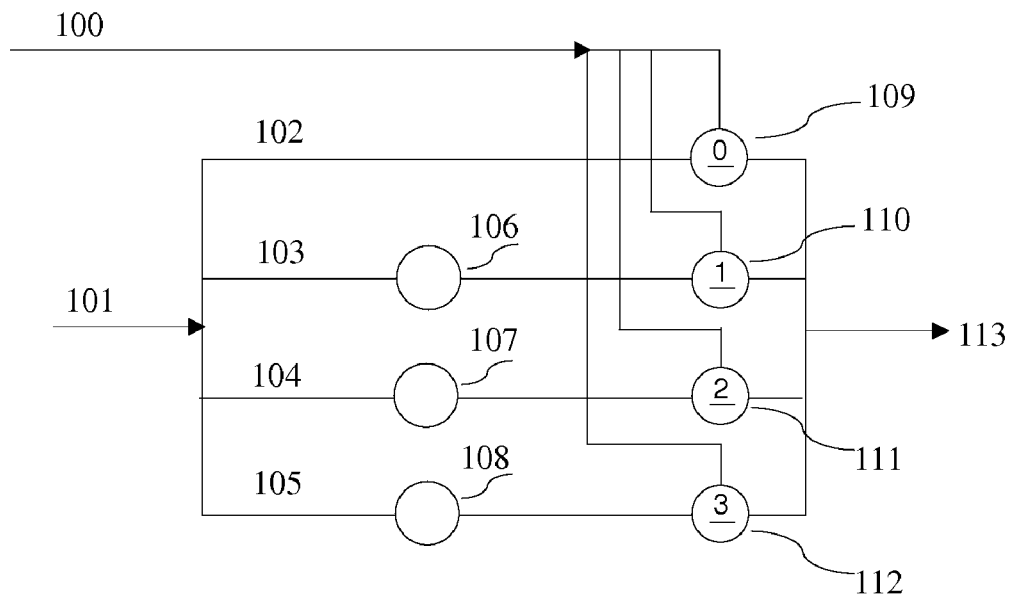
FIG. 1 is a diagram of a 4-valued function realized with switches and inverters.

Aspects of the present invention provide novel implementations of n-valued with n>2 and binary logic functions by what are called non-magnitude based physical phenomena. This is intended to mean that each state is represented by an instance or appearance of a physical phenomenon that is difficult to confuse with another state for instance by the effects of noise. One may make a mistake in determining a presence of a state while the state is not present due to the presence of significant noise. However in most cases under normal circumstances it should be difficult to confuse the presence of one state with the presence of another state.

For instance in the case wherein a symbol is represented by an electrical signal with a frequency f1, and noise with a spectral component in f1 and sufficient amplitude is present, then one may decide that a symbol in state f1 is present when in actuality it is not. It is assumed however that in operational conditions the detection of the presence or the absence of symbols in a certain state can be performed error free, for instance by providing each signal with a magnitude in intensity that is sufficiently above the statistically meaningful level above occurring noise levels. A magnitude of each signal or symbol representing a state may be identical, so that detection of such a signal involves other physical aspects besides detecting a magnitude. It may involve for instance detecting a magnitude at a certain frequency or wavelength.

These aspects may involve the frequency of a signal. They may also involve electronic spin, wavelength, ionization level, polarization, position, duration, direction, presence of a molecule or an atom or ion, refraction angle or any physical phenomenon that can be detected as being meaningful present or absent within occurring environmental noise levels. For instance a presence of a certain protein may signify an occurring logic state. Such a presence may be an entirely discrete event, because under assurance of absolute detection of any presence, there can be no confusion of presence of one protein with the presence of a difference protein. Clearly confusion is possible in situations wherein occurrence of a certain level or concentration of a single protein determines a logic state. Environmental conditions, for instance when by change in temperature more material is produced than expected, may lead to inaccurate and wrong decisions. The amount of material may be considered a magnitude based phenomenon.

As an easy to understand illustrative example optical signals with different wavelengths will be used to represent different logic states will be provided. A related method and apparatus to switch between logic states will also be provided. A similar approach will be provided for electrical signals. A method using proteins and biomaterials as indicators of a logic state and a related switching mechanism implementing a truth table will also be provided.

In an earlier invention as disclosed in U.S. Pat. No. 7,218,144 issued on May 15, 2007, which is incorporated herein by reference in its entirety, an n-state switch is provided having an input enabled to receive a signal representing one of n states, an output enabled to provide a signal having one of n states and a control input enabled to receive a signal representing one of n states. When the signal on the control input represents a first state then the output provides a signal. When the signal on the control input represents not a first state then depending on the selected implementation of the switch one of two things can happen. The first thing is that in that case no signal will be provided on the output. The second thing that may happen if the first thing does not happen is that a signal will be provided on the output that is different from the signal on the input. As a further variation one may change conditions so that a signal will always appear on the output when the control input does not receive a signal representing a first state.

As an aspect of the present invention a binary and an n-state switch is provided that switches a signal from an input to an output under control of a control signal wherein a signal representing a logic state is an instance of a physical phenomenon and wherein determination of a state is not dependent on a relative magnitude of the signal. In other words a state is detected when a signal is detected. The magnitude, such as an amplitude or an intensity of the signal once above a minimum detection level, does not matter for determining the state.

An n-state switch then has an input which is enabled to receive an n-state signal which can assume one of n states or represents a symbol having one of n states. The n-state switch also has a control input enabled to receive an n-state signal which can assume one of n states or represents a symbol having one of n states. The n-state switch has an output which can provide an n-state signal which can assume one of n states or represents a symbol having one of n states. The output of the n-state switch provides a signal identical or reversibly related to the state of the signal on the input when the state of a signal on the control input is in a first of n states. What is provided on the output of the n-state switch when the signal on the control input is not in a first state depends on how states are represented. For instance it may be that absence of signal represents a state. In that case the signal on the output will assume a state equivalent to the state corresponding to absence of signal on the input when the state of the control input is not a first state. It may also be that absence of signal is just that: absence of signal and does not represent a state. Also in that case the signal on the output will assume a state equivalent to the state corresponding to absence of signal on the input when the state of the control input is not a first state. This means that a signal on the output in that case will not represent one of n states.

Many further variations of a switch are possible certainly when one works with n states. These variations are contemplated and are in essence a permutation of the earlier description.

Implementing an N-Valued Truth Table

How to implement n-valued and binary 2-input/single output truth tables by using gates and inverters was disclosed by the inventor in U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS, in U.S. Pat. No. 7,218,144, issued on May 15, 2007 entitled SINGLE AND COMPOSITE BINARY AND MULTI-VALUED LOGIC FUNCTIONS FROM GATES AND INVERTERS and in U.S. patent application Ser. No. 11/686,542, filed Mar. 15, 2007, entitled SINGLE AND COMPOSITE BINARY AND MULTI-VALUED LOGIC FUNCTIONS FROM GATES AND INVERTERS which are all incorporated herein by reference in their entirety.

As an illustrative example a 4-valued truth table, determining a 4-valued adder Add4 over GF(4) is provided.

| Add4 | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |

This truth table can be implemented by the circuit as shown in diagram in FIG. 1. The circuit implements the columns of the truth table. The circuit has two inputs 100 and 101. Input 101 is split into 4 channels: 102, 103, 104 and 105. Each cannel is an implementation of a column of the truth table of Add4: channel 102 implements first column [0 1 2 3]; channel 103 implements [1 0 3 2]; channel 104 implements [2 3 0 1]; and channel 105 implements [3 2 1 0]. It should be clear that Add4 is commutative and columns can also mean rows in this case. Column [0 1 2 3] is identity so no change of input is required, column [1 0 3 2] is implemented by inverter 106, column [2 3 0 1] is implemented by inverter 107 and column [3 2 1 0] is implemented by inverter 108.

Inverters can be represented by mapping of a first n-valued vector with n elements to a second vector with n elements. One can represent vectors as columns or as rows. In column form the 4-valued identity inverter and inverters 106, 107 and 108 can be represented as:

| identity | | Inv 106 | | Inv 107 | | Inv 108 | |
|---|---|---|---|---|---|---|---|
| 0 | | 0 | 1 | 0 | 2 | 0 | 3 |
| 1 | | 1 | 0 | 1 | 3 | 1 | 2 |
| 2 | → | 2 | 3 | 2 | 0 | 2 | 1 |
| 3 | | 3 | 2 | 3 | 1 | 3 | 0 |

One may also represent an inverter as row vector. A 4-valued identity inverter may then represented as [0 1 2 3]→[0 1 2 3]. Because an inverter may assumed to be described starting from an identity [0 1 2 3] one can reduce describing an inverter as the resulting vector. Accordingly in row vector representation Inverter 106 is then [1 0 3 2].

Figure 2:
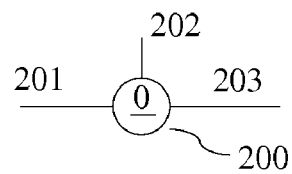
FIG. 2 is a diagram of an n-valued switch.

FIG. 1 further has 4 gates: 109, 110, 111 and 112. Each gate has a number in it. Gate 109 is shown in more detail in FIG. 2 as 200. Gate 200 has an input 201, a control input 202 and an output 203. The horizontal line inside the gate symbol means that the gate is conducting from input 201 to output 203 when the control input has the state indicated by the number inside the gate symbol. In all other states of control input 202 the input 201 is insulated from output 203. In FIG. 2 the number inside the gate symbol is 0. Accordingly the input 201 is conducting to the output 203 when the control input has state 0. The output is insulated from the input when the control input is not in state 0.

A vertical line inside the symbol means the opposite. Input and output are insulated for a certain state of the control input and conducting to each other for all other states of the control input. Or more formal: an n-state has an input enabled to receive a signal having one of n-states, a control input enabled to receive a signal having one of n-states and an output enabled to provide a signal having one of n-states. The signal on the output will have a state identical or reversibly related to the state of the signal on the input when the signal on the control input is not in a first state. The signal on the output will be in a state identical to absence of signal at the input.

One may say that a switch is conducting when the control input has a certain state. Conducting in the context of the present disclosure means the output assuming the same state as the input. Further more non-conducting or insulating may have two different meanings, depending on the meaning of absence of signal. Absence of signal may represent a state. In that case non-conducting or insulated means automatically assuming the state represented by absence of signal. In other cases insulated or non-conducting means that an output has an absence of signal and no logical state is implied. Accordingly the term 'conducting' is related to having the same state. It will be shown later that input and outputs may be presented by different phenomena; for instance by an optical signal at the input and an electrical signal at the output. In physical sense there cannot be a conducting of signals. However in a logical sense when the optical signal at the input represents the same state as an electrical signal at the output one may still say in the context of the present invention that the input is conducted to the output.

One can then interpret the diagram of FIG. 1 as: input 100 may have one of 4 states. Depending on the state of the signal provided on input 100 one of the channels 102, 103, 104 or 105 is conducting from input 101 to output 113. Accordingly the output 113 provides a signal that depends on the signal received on input 101 and depending on the conducting channel is unmodified if channel 102 was conducting or is modified by one of the inverters 106, 107 or 108, each of the channels implementing a column in a truth table if one of the respective channels was enabled. Accordingly FIG. 1 implements a 4-valued truth table.

The next step is to introduce state detectors and state generators to implement no-magnitude based state inverters. Magnitude based logic inverters are known. For instance a ternary magnitude based electronic ternary inverter is disclosed in U.S. Pat. No. 6,133,754 issued October 17 to Olson. Non-magnitude based inverters may be novel.

Figure 3:
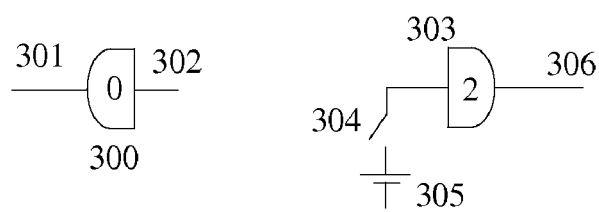
FIG. 3 is a diagram of a detecting element and a generator element of an n-valued inverter in accordance with an aspect of the present invention.

As a first illustrative example FIG. 3 provides a diagram of a state converter or inverter wherein a state may be represented as a non-magnitude based signal. Non-magnitude based herein means that the presence of such a signal can be detected unambiguously but is not dependent on a magnitude apart from a minimum detectable level to constitute a state. Once the presence can be detected above a minimum level $lev_0$ it does not matter what the level is. For practical reasons one may want to limit the maximum level of a system to prevent damaging a sensor, prevent saturation or other adverse effects. However for logical purposes it does not matter if the detected signal is $lev_0$ or for instance $25lev_0$ as both will represent the same state.

Accordingly an element of an n-valued state inverter can be a detector 300 with an input 301 and an output 302. The input 301 receives a signal representing an n-valued logic state. The number inside the detector symbol provides the state for which detection is enabled. In the example of FIG. 3 a detector 300 can detect a signal representing state 0 received on input 301. The signal on output 302 provides a signal which can have two states: a first state (for instance absence of signal) when the detected signal does not represent state 0 in this example. A second state of the signal provided on 302 may be a state HIGH which indicates that a signal representing state 0 in this example was detected. In one exemplary embodiment the detector can be an optical detector tuned to detecting a certain wavelength. For instance light with a wavelength in the range of red light may represent the state 0. A broadband light detector with a red filter may be used as a state 0 detector. Assuming that for instance blue and green represent other states and perhaps IR light a fourth state, the detector 300 will only provide a level HIGH, when red light is received. One may increase the number of states for instance represented by optical signals by using narrow band detectors and filters for wavelengths representing specific states. Optical sensors, tuned detectors and optical filters are widely available in the current marketplace.

A second element in the inverter is the state generator 303. Applying the optical example, the generator may be an optical source such as a LED or a tuned laser which will provide a light signal of a specific wavelength or bandwidth around a certain wavelength when activated. The light source 303 may also be a broadband light source with a specific filter to create an optical signal with a preferred wavelength representing a logical state.

A state generator 303 is activated by a switch or event 304. The switch or event 304 is activated when the output 302 of detector 300 provides a signal HIGH. In the optical example this may mean that a signal HIGH on 302 closes the switch 304 and provides a power from power source 305 which enables generator 303 to generate a signal on output 306. In the example a 2 is inside the symbol of generator 303 which means that a signal is generated which provides a signal representing state 2. The switch or event 304 may be configured in such a way that it opens and disconnects the enabler such as a power source when the signal on 302 is not HIGH.

Figure 4:
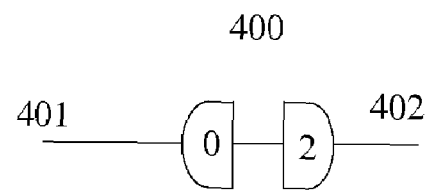
FIG. 4 is a diagram of an element of an n-valued inverter in accordance with an aspect of the present invention.

One element of an inverter may then be represented by FIG. 4 as 400 with input 401 and output 402. This diagram means that the signal on 402 represents state 2 when the signal on 401 represents state 0. When a signal on 401 represents states other than 0 no signal is provided on 402.

Figure 5:
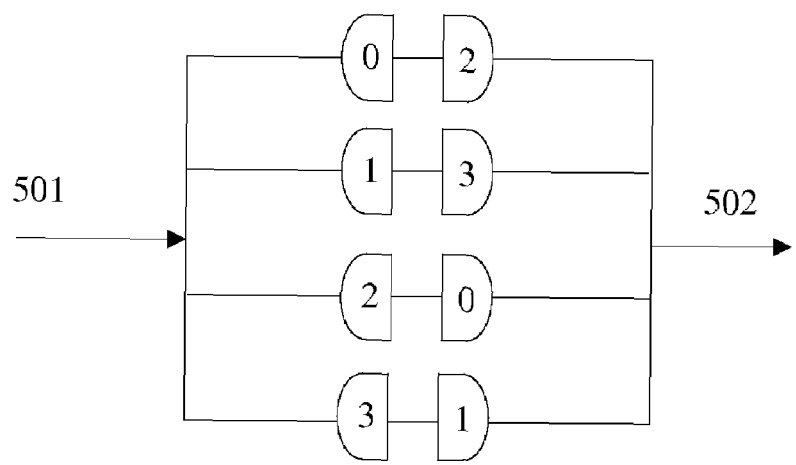
FIG. 5 is a diagram of an n-valued inverter in accordance with an aspect of the present invention.
Figure 6:
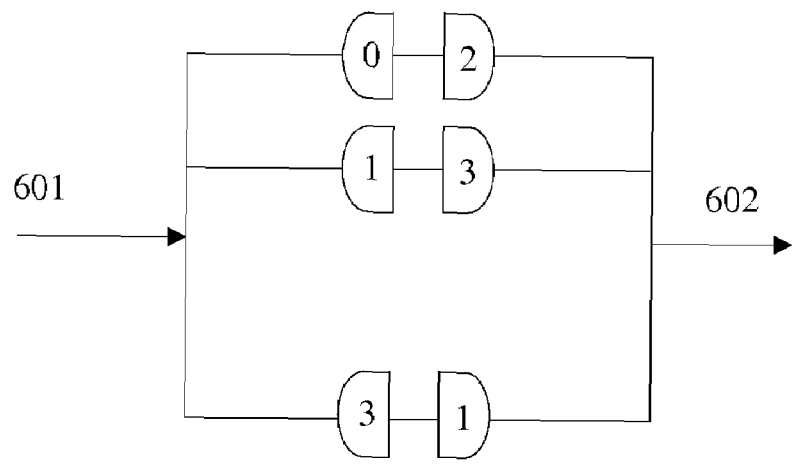
FIG. 6 is another diagram of an n-valued inverter in accordance with an aspect of the present invention.

A complete reversible 4-valued inverter representing inverter 107 of FIG. 1 is shown in diagram in FIG. 5. One can easily check that FIG. 6 represents the same inverter of FIG. 5 for the case wherein state 0 is represented by absence of signal.

It is pointed out that positioning in FIG. 1 of a gate after or behind an inverter is required in the case wherein absence of signal represents a logic state. However when absence of signal does not represent a logic state a gate may also be positioned in front or before an inverter, as absence of signal should not generate an output signal.

The construction of a gate or switch for conducting or stopping a signal providing a state will be provided next, again using an optical signal for an illustrative example.

Figure 7:
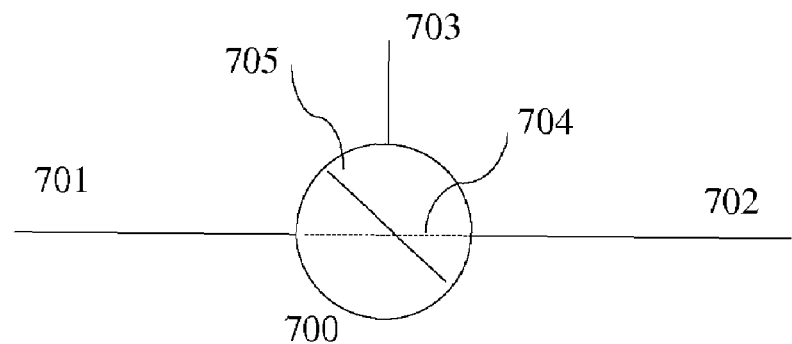
FIG. 7 is a diagram of a switch in accordance with an aspect of the present invention.

There are several ways to realize such a switch. In a first embodiment an optical switch may assumed to have a broad enough bandwidth to conduct any of the signals representing a state when the switch is in a conducting position. This is illustrated in FIG. 7. An optical switch 700 has an optical input 701 and an output 702 providing an optical signal that is detectable. The switch 700 has a mechanism under control of an optical signal provided on control input 703. The control signal may be all optical, or it may be an electrical signal that is generated from detecting an optical signal. The presence of the correct optical signal that is provided to 703 will make the switch 700 conducting. For instance 700 may be a micro electromechanical system (MEMS) device, wherein for instance a small mirror is switched. When the correct control signal is present the mirror is positioned in such a way that a conducting optical path 704 is created from input 701 to output 702. When the correct control signal is not present then an interrupted path 705 is created and output 705 receives no optical signal.

One can make 700 all optical, or electro-optical. For instance under influence of an electronic signal derived from an optical signal one may change transmission properties, including polarization or refraction of an optical path.

Figure 8:
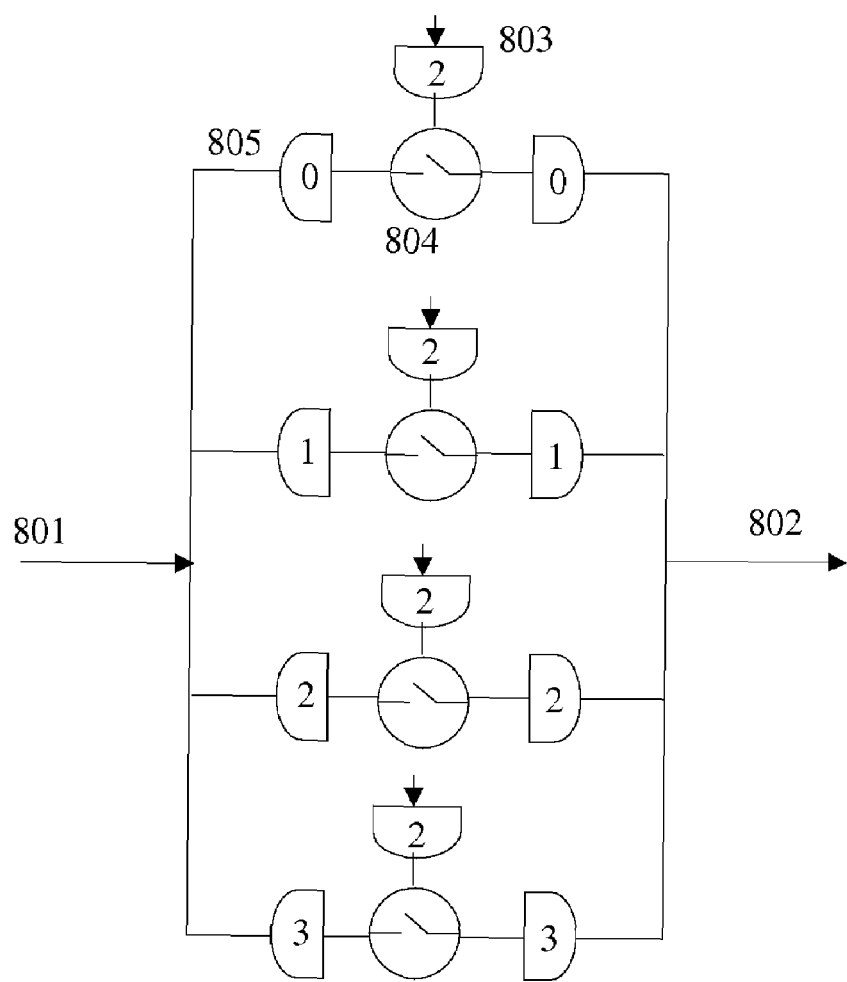
FIG. 8 is a diagram of a switch in accordance with another aspect of the present invention.

A possible electro-optical switch is shown in FIG. 8. Each optical signal representing a state has a detector and a generator for generating the signal representing Looking from the outside when red light goes in and red light goes out it appears to make no difference if some translation mechanism was involved. It still looks like there is conduction of light. However one may have for instance different wavelength of light representing the same state. Or one can have different types of signals (for instance light in and electrical signal out) which represent a same state. Also in those cases one may say that a switch is conducting when input and output state are the same.

Figure 8A:
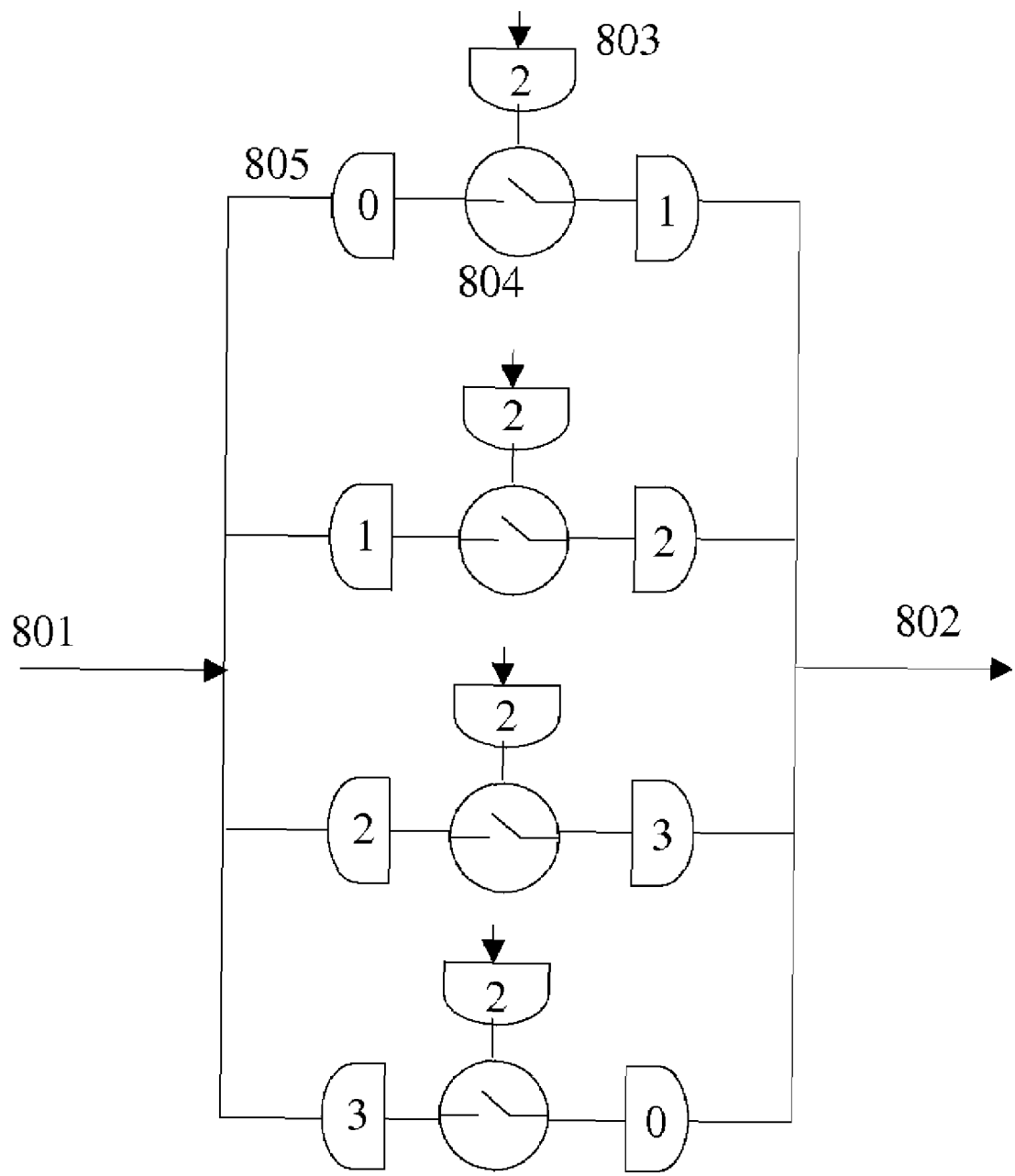
FIG. 8a is a diagram of a switch in accordance with yet another aspect of the present invention.

FIG. 8*a* shows a variant of the diagram of FIG. 8. Herein the channel that detects state 0, when activated will generate state 1. The channel detecting state 1 when activated will generate state 2, etc. In such a case a switch and an inverter are incorporated into one device. Accordingly one should adapt the description of an n-state switch as: an n-state switch has an input enabled to receive or receive and detect a signal having one of n states, a control input enabled to receive or to receive and detect a signal having one of n states, and an output, an output enabled to activate a signal having one of n states when the signal on the control input is in one of n states.

The optical case is presumably easy to visualize. One may assume as another illustrative example the components to be electronic components where a detector is an electronic frequency dependent filter with a voltage detector. A generator may be for instance an oscillator that is switched on from a power source.

Figure 9:
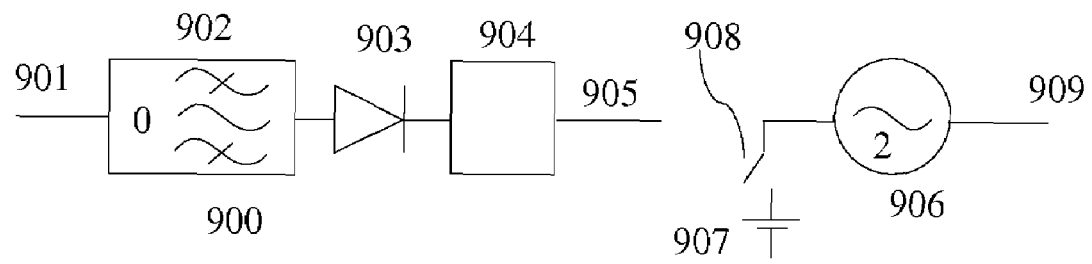
FIG. 9 is a diagram of a switch in accordance with yet another aspect of the present invention.

FIG. 9 shows a state detector 900 and generator 906 for an illustrative embodiment wherein a logic state is represented by a signal of a pre-determined frequency. Such a signal may be inputted on input 901 of a bandpass filter 902. Assume the signal to represent a state 0. Assume further that only a signal representing state 0 will be passed by the filter 902 and that all other signals representing states 1, 2 and 3 being the remaining states of a 4-valued logic will be rejected to an undetectable level by a detector connected to the output of the filter. Such a detector may be for instance a rectifier 903 followed by a level detector 904. The level detector 904 provides for instance an absence of signal when no signal representing state 0 was present at input 901 and a level HIGH when a signal representing state 0 was present at input 901. It would be clear to a person skilled in the art that a signal representing state 0 must have a minimum amplitude to make the set-up practical. Beyond being sufficiently above noise level and above minimum detection level it should not matter how large the signal amplitude is. Detection of the presence or the absence of a signal here described are well known.

A generator 906, which may be a Voltage Controlled Oscillator (VCO) can be connected to a power source 907 through a switch 908 to activate the VCO 906 and provide output 909 with the signal generated by the VCO. Assume that power source 907 makes 906 to generate a signal that represents logic level 2. This signal has a different frequency than a signal representing state 0. Switch 908 is activated by the signal provided on output 905. When output 905 provides a signal HIGH then the switch 908 is closed and the power source 907 activates the VCO, causing a signal representing state 2 to be provided on output 909. When output 905 has absence of signal, then the switch 908 is open and the power source is disconnected from the VCO and no signal is provided on 909.

One can represent the combination of filter/detector and VCO generator symbolically as shown in FIG. 4. Accordingly one may create a 4-state inverter as shown in FIG. 5 that is not magnitude dependent but depends from the frequency of signals.

Figure 10:
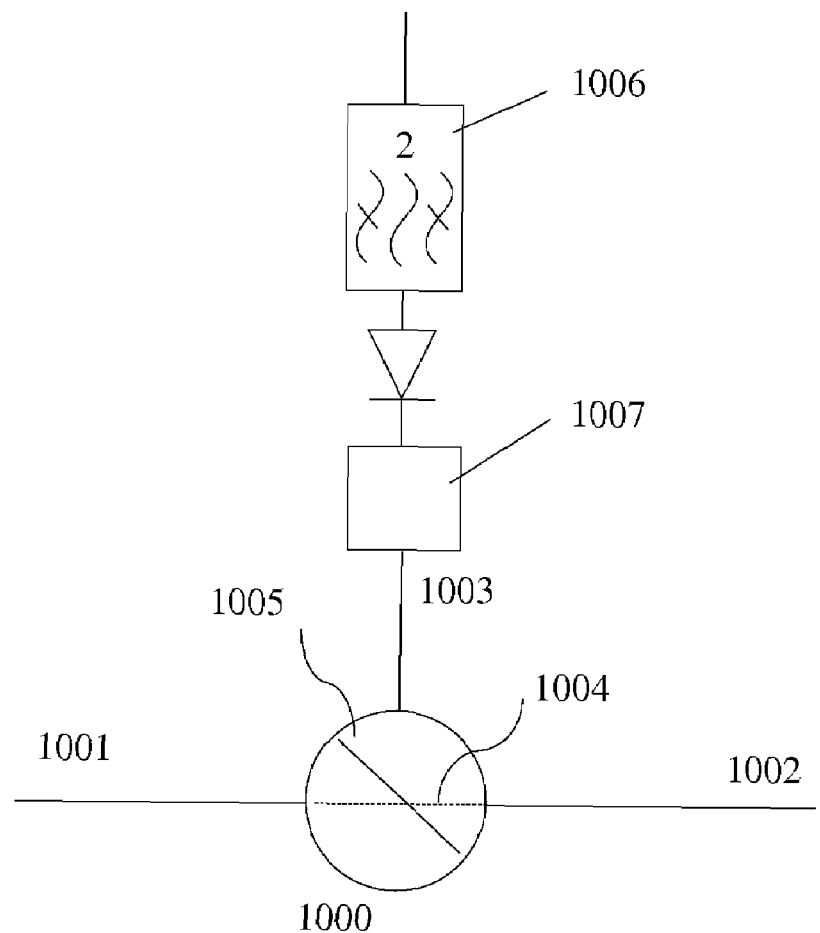
FIG. 10 is a diagram of a switch in accordance with yet another aspect of the present invention.

A gate or switch that will conduct from input to output when a control input is in a certain state for the case wherein a logic state is an electrical signal of a certain frequency is provided in FIG. 10. Herein a filter 1006 followed by a detector 1007 determines the presence of a signal representing state 2 in this illustrative example. If such a signal is present it is passed through the filter 1006 to a rectifier and a level detector 1007 which will generate a signal HIGH on a control input 1003 if a signal above a certain minimum is detected. If 1003 is provided with signal HIGH a switch 1000 will be put in position 1004, which may conduct an input 1001 electrically to an output 1002, putting output 1002 in the same logical state as input 1001. When no signal representing state 2 was detected on the control input 1003 then the switch 1000 will be in open position 1005 and output 1002 will have absence of signal, which may or may not be a logic level. In that case output 1002 may be put to ground or 1002 may have an infinite impedance preventing a floating level of the output 1002.

A signal or a phenomenon to be detected has to have some magnitude, such as an amplitude, or mass or intensity. However the magnitude does not play a role in differentiating between states. In order to make sure that magnitudes do not play a role one should make sure that a selected detector which is tuned to a certain state is not able to detect a different state, no matter how large its magnitude is. All within reason of physical limitations. Accordingly a state, being one of n states can be represented by a physical phenomenon having a characteristic, the physical phenomenon being able to occur in n distinguishable instances of a characteristic wherein the characteristic of a first distinguishable instance of the phenomenon cannot be added to the characteristic of a second distinguishable instance of the phenomenon to create a third instance of the phenomenon. Or in other words each distinguishable instance has no detectable relation of its characteristic with the characteristic of another distinguishable instance of the same phenomenon.

A state being an independent instance of a characteristic of a physical phenomenon means that a first instance of a characteristic of a physical phenomenon occurring at the same time as a second instance of a characteristic of a physical phenomenon will NOT create by using linear means a third instance of a characteristic of a physical phenomenon. For instance if a first instance of a characteristic of a physical phenomenon is light with a first wavelength and a second instance of a characteristic of a physical phenomenon is light with a second wavelength different from the first wavelength then just linear adding the two states will merely provide two states. If the first and the second wavelength are identical then adding of the two states will generate the same state. This is different from dependent instances. For instance if a first state is represented by a signal of 1 Volt and a second state is represented by a signal of 2 Volt then addition of the two signals will create a signal of 3 Volt, assuming that no limiter is applied. A signal of 3 Volt may represent a third state. Further more adding two signals of both 1 Volt will generate a signal of 2 Volt, which represented a second state. Accordingly a voltage in the context of a linear circuit is not an independent instance of a characteristic of a physical phenomenon.

For instance one can have a first molecule that is attracted to a receptor and a second molecule that is not attracted to a receptor. There is no linear relation between the two instances or molecules. An electrical signal having a frequency of 100 Hz and a second electrical signal having a frequency of 3000 Hz do not create a signal of 3100 Hz unless signals are combined by some mixing or non-linear device. If one takes a narrow enough filter around 100 Hz, then one will not be able to detect a signal of 3000 Hz with such a filter.

Accordingly one may designate occurrences of a phenomenon in different instances of a characteristic (such as frequency, wavelength) and that are not magnitude dependent on each other and can be differentiated from each other as independent instances of a characteristic. A signal having a state in that context is the physical phenomenon having an instance of the characteristic. Accordingly an electrical signal having a frequency is a signal that can represent a state, and a beam of light having a wavelength of red light is a signal that can represent a state. An ion having a charge may also be a signal that represents a state. And a material such as a protein that can be detected or attracted by a receptor can also be a signal that represents a state. Accordingly all the signals in the above examples can represent a state.

The ability to detect a single state independent of a second signal has a positive side effect. One can actually generate as a result of a state detection two or more states that will not interfere with each other. One may call an instance of a characteristic of a physical phenomenon independent when two independent instances can not form a third independent instance within an apparatus. Independence also means that when a first independent instance represents a state and is combined with normal noise like environmental circumstances it can not form a second independent instance that forms a state.

Non-Traditional N-Valued Functions

In general one may assume that an n-valued logic function (including a binary function) is represented by a 2-input/single output n by n truth table. Practically most logic circuits use 2 input single output functions as building blocks. In practice it is also known that actual circuits are almost never strictly 2 input/single output. In most cases an Integrated circuit (IC) is multi-input/multi-output. Using a 2-input/single output function is a convenient way to work with relatively simple and re-usable components. For instance the known Karnaugh diagram is a truth table with more than 2 variables, and with not all inputs being used and of which an output state can be a don't care state.

Figure 11:
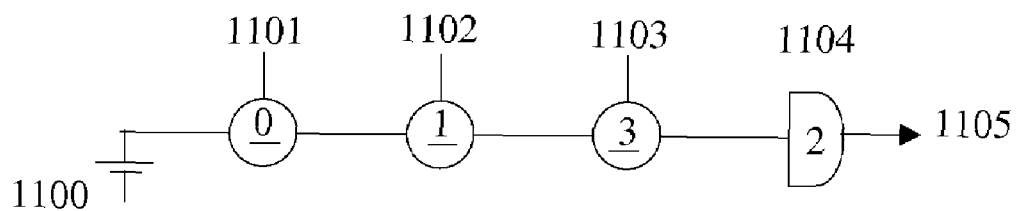
FIG. 11 is a diagram of a circuit implementing a state depending from multiple input states in accordance with an aspect of the present invention.

Inverters can be convenient to realize all possible logic states for one channel at a time. A channel is enabled by an n-valued switch with a control input. If it is not possible or practical to implement all states of a complete inverter it may be a better approach to implement a single n-valued output state by a plurality of n-valued switches. An illustrative example is provided in diagram in FIG. 11. Assume that the state 2 will be generated when signals provided on three inputs are 0, 1 and 3. Such an output state may be part of a more complicated 3 input 4-valued function. It may also be that the function generates no output signal for any other input combination. The output can be realized by having a state generator 1104 for state 2, which may be a wavelength or a protein. The state generator is activated by a source 1100, which is only enabled on the generator when 3 series switches are conducting at the same time. This only happens when the control inputs 1101, 1102 and 1103 to their respective switches have the appropriate signals to make the switches conducting or provide the same signal at the output as provided on the input. One may interpret the three switches being conducting as enabling a source to a generator.

Figure 12:
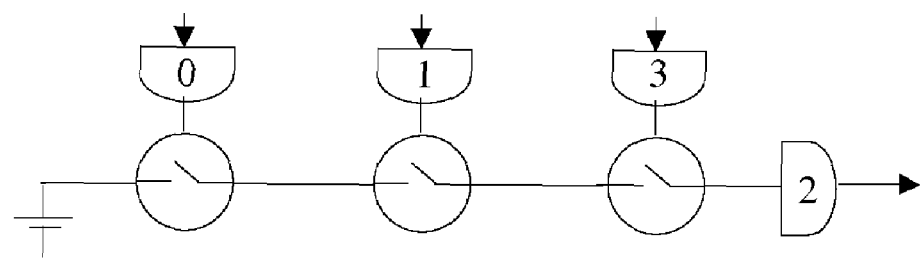
FIG. 12 is another diagram of a circuit implementing a state depending from multiple input states in accordance with an aspect of the present invention.
Figure 12A:
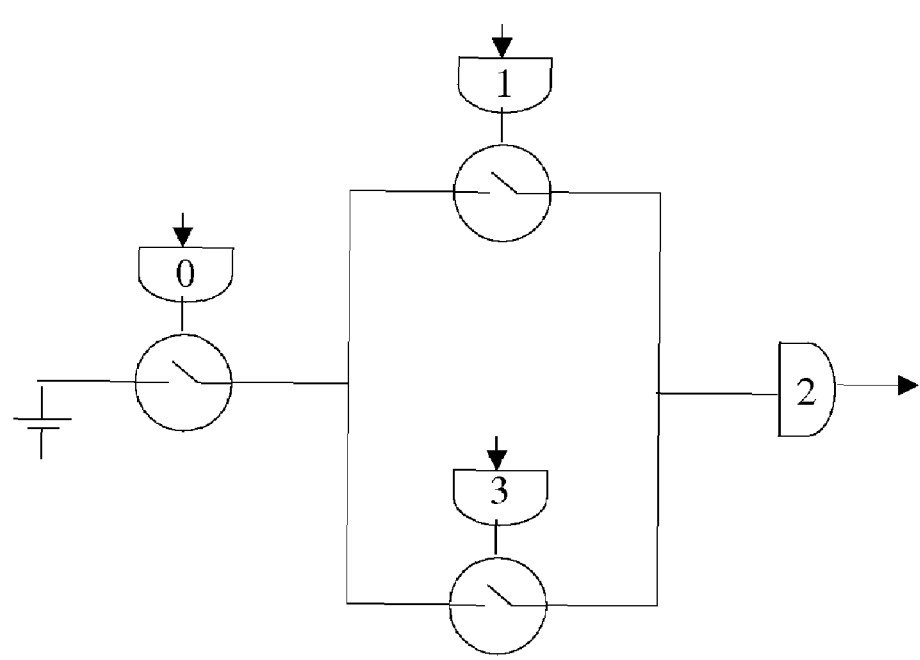
FIG. 12a is yet another diagram of a circuit implementing a state depending from multiple input states in accordance with an aspect of the present invention.

It is shown in diagram in FIG. 12 that as before switches may be enabled by a detecting a signal by a detector; the detector providing a signal HIGH that will close the specific switch. One can thus make a generated state dependent from a plurality of input states. One may modify the conditions for generating the output state. For instance FIG. 12*a* shows that a state 2 will be generated if a first input state is 0 and either a second input state is 1 or a third input state is 3. Also other conditions are possible and are fully contemplated.

It should be clear that any binary and multi-valued state can be realized from detector enabled switches, a state generator and a source to power or enable the state generator. This allows creating almost any state in n-valued and binary logic from switches and generators. In many cases it will however require that all states, including the 0 state, are represented by a signal and that no state is represented by absence of signal. This method is particularly effective when a state is represented by an independent instance of a characteristic of a physical phenomenon.

In general one tries to minimize the number of states. For instance an n-valued truth table has at most n different states. When one has two different n-valued functions or binary functions it is generally assumed that equivalent states have equivalent representations. That is: assume a first function generates a state 2 which is represented by a signal. A second n-valued function that also generates a state 2 is generally expected also to be represented by a same signal. The reason is that output signals of a function are often again input signals for a new function. Also magnitude based signals make it almost impossible to assign and transmit and detect different signals representing a same state. The aspect of transmitting different states over one channel, or state multiplexing, is much simpler if states are being represented by independent signals. Because of their independence such signals can be transmitted simultaneously without interfering with each other.

This ability to have multiple signals using a channel at the same time is known and is called multiplexing. Known multiplexing methods are: wavelength multiplexing, time division multiplexing and frequency division multiplexing. Another form of multiplexing is independent material multiplexing, wherein different materials that will not interfere or react with each other is transported through a channel.

Bio-sensors are known for detecting at least three instances of a biomaterial of a group which may include a cell, a virus, an antibody, a chemical, a protein, a peptide, a nucleic acid, an oligosaccharides, a nucleotide, a metabolite, a drug, an ion, a carbohydrate, a polysaccharide, a hormone, an antigen, an enzyme, an RNA or a DNA molecule are known. Detection of such a material may be achieved by transductions with electrochemical, field-effect transistor, optical absorption, fluorescence or interferometric devices. Detection of a biomaterial creates an optical, an electrical or a chemical signal that may be further detected amplified and transformed into for instance an electrical signal.

One material that acts both as a state and a channel is Transfer RNA. Transfer RNA is a small RNA chain that transfers a specific amino acid. It has sites for amino-acid attachment and an anticodon region for codon recognition that binds to a specific sequence on the messenger RNA chain through hydrogen bonding. Accordingly RNA molecules provide both a representation of a state, a channel for multistate multiplex transport and for unique detection of a state. Accordingly RNA molecules enable implementation of an n-valued and binary logic function.

Accordingly the presence of a detectable material including a biomaterial may serve as a logic state. Using a biomaterial as an illustrative example: After detection of a specific biomaterial or a specific state a generator may release another detectable material that serves as a state. Different embodiments exist for releasing a material in response to for instance an electrical material or in response to detecting a material. Devices that can release biomaterials in response to a signal originating from a biosensor are for instance disclosed in U.S. Pat. No. 5,797,898 issued on Aug. 25, 1998 to Santini Jr. et al. which is incorporated herein by reference in its entirety. Other molecular release or delivery systems are also known. For instance U.S. Pat. No. 7,104,517 to Derand et al. issued on Sep. 12, 2006 and which is incorporated herein by reference discloses polymer valves which can open or close microchannels to micro-chambers under for instance influence of an electric field. Accordingly in response to an activating signal one can thus release at least one of three instances of a biomaterial of a group which may include a cell, a virus, an antibody, a chemical, a protein, a peptide, a nucleic acid, an oligosaccharides, a nucleotide, a metabolite, a drug, an ion, a carbohydrate, a polysaccharide, a hormone, an antigen, an enzyme, an RNA or a DNA.

Having provided a detection as well as a generating mechanism for biomaterials thus in accordance with an aspect of the present invention an n-state switch can be implemented.

Detectors of bio-materials including DNA detectors are widely known. For instance Affymetrix offers arrays of detectors in its GeneChip® technology. A further example of detectors of proteins and peptides is provided in U.S. Pat. No. 6,824,669 to Li et al. issued on Nov. 30, 2004 which is incorporated herein by reference. One can thus enable a switch with an input to detect a first material with a first bio-sensor, a control input with a second bio-sensor to detect a second material and an output with a chip enabled to release a material that represents the same state as the first material or a different state when the second bio-sensor detects the second material.

In one embodiment of a material representing a logic state one may assume that a channel is an open channel and that the material representing a first state can reach the detector of an input of an inverter and a second material representing a second state can reach a detector of the control input. In that case different materials may have to represent a same logic state.

Separation of channels may be formed by a membrane which will separate materials to one side and another side. A sensor may be embedded in the membrane to detect a material on one side of the membrane and initiate release of a material on the other side of the membrane. A channel may be a fluid which contains materials and allows movement of materials from one place to another. A sensor may detect a material and remain in the state of the detected material until the detector is reset or a material in the fluid neutralizes or washed away the material. An internal signal from a detector may also reset a state, either by releasing a material or by rendering an area of the detector inactive for a period of time.

Figure 13:
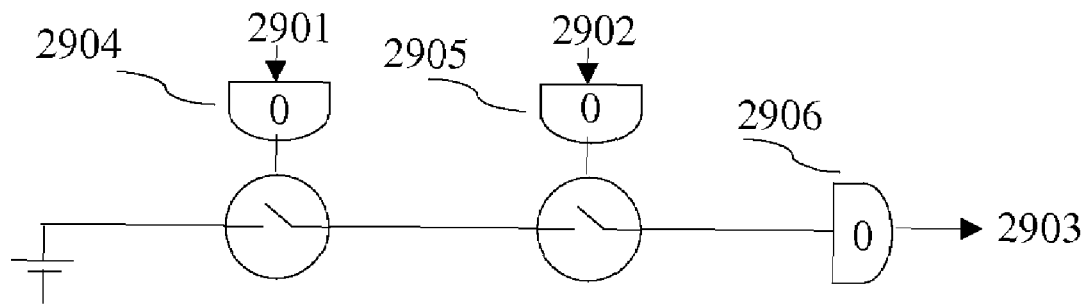
FIG. 13 is a diagram of a device also implementing a logic function in accordance with the present invention.
Figure 13A:
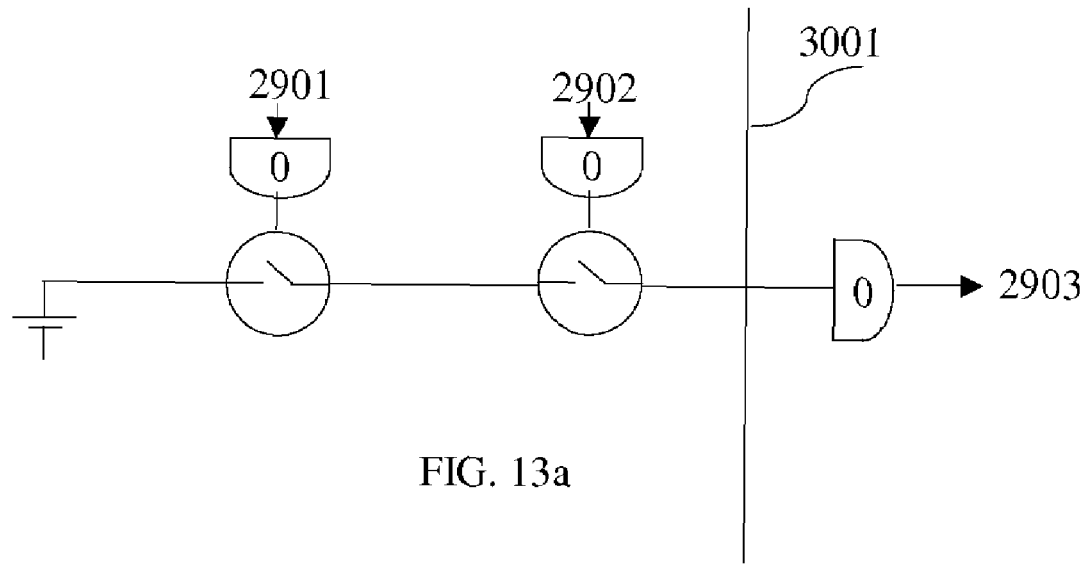
FIG. 13a is a diagram of a device also implementing a logic function in accordance with the present invention.

The use of materials such as biochemical materials may require having different materials represent the same logic state. As an example the diagram of FIG. 13 is used. Assume that a device has to generate a state 0 when 2 different inputs have a state 0. Assume that the environment is for instance a fluid that carries the input materials and that will have to carry the output material. In that case a distinction has to be made between a material representing state 0 on input 2901 and a material representing state 0 on input 2902. Furthermore if all materials in the environment can reach the inputs 2901 and 2902 then one may need the material generated on output 2903 representing a state 0 to be distinct from the other materials if feedback is undesirable. One solution may be to physically separate inputs by using a separation. This is shown in FIG. 13a wherein a separation 3001 which may be a membrane is provided to separate for instance the inputs from the output. One may also provide for instance a separation such as a membrane between the two inputs 2901 and 2902 thus potentially allowing the same material to represent the same state at an input.

In FIG. 13 the device 2904 may be a biosensor enabled to detect a first material; the device 2905 may be a biosensor enabled to detect a second material and device 2906 is a device that can release a material from a micro-chamber on a chip as disclosed in response to a signal in accordance with earlier cited U.S. Pat. No. 5,797,898.

Accordingly it has been shown that an n-state switch has been enabled, the n-state switch having at least a first input enabled to detect the presence of a signal being in a first of n states; a control input enabled to detect the presence of a signal being in a second of n states; and an output, the output enabled to provide a signal representing a third of n-states when the at least first input is in the first state, and the control input is in the second state; and the n-state switch is disabled to provide a signal in a third state when either the first input is not in the first state or the control input is not in the second state or when the first input is not in the first state and the control input is not in the second state.

Figure 14:
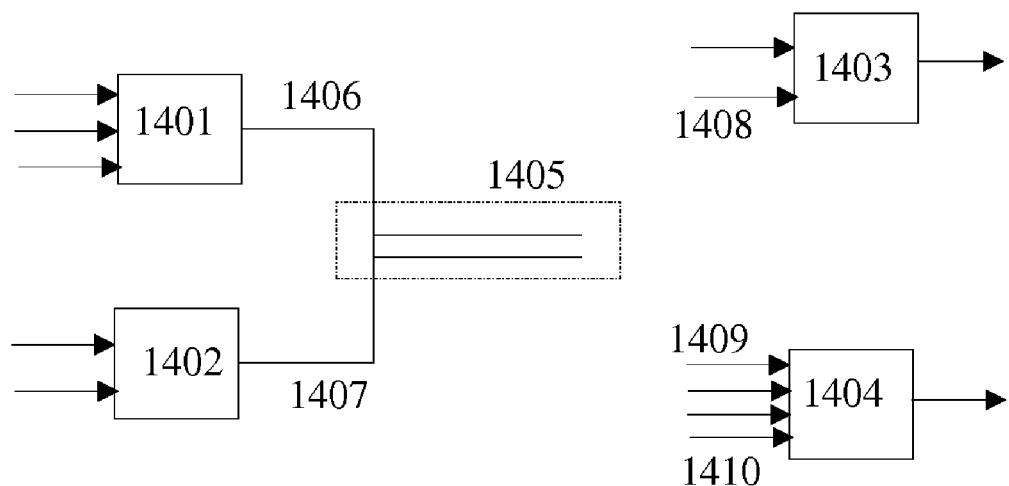
FIG. 14 is a diagram of a multi-input logic circuit in accordance with an aspect of the present invention.

The ability to distinguish an occurrence of a single state independently from the occurrence of another state has an additional positive side effect. One can actually generate as a result two states that will not interfere with each other. This can lead to some unusual but very useful configurations. FIG. 14 shows in diagram an illustrative example, having a device 1401 with three inputs and one output 1406 and a device 1402 with 2 inputs and one output 1407. An output of the device may have the same logic state in an n-valued logic, however a state generated by device 1401 may be represented by a different independent representation as the same state generated by device 1402.

Because the representations are independent one can transport both over the same channel 1405. This allows a target device to have inputs that are sensitive to different representation of states. A target device 1403 may have two inputs of which an input 1408 is only sensitive to output signals of device 1401. A target device 1404 may have 4 inputs of which an input 1409 is sensitive to the output 1406 and input 1410 is sensitive to the output 1407.

It is common to have a computer work under a clock signal. A clock signal may determine which functions are active and which part of memory is read from or written to and may determine other functions. A clock signal, assumed to mean making a function active or inactive, for materials for instance for proteins may be provided by modulators which may make proteins active or inactive. Such modulators are for instance disclosed in U.S. Pat. No. 6,953,656 to Jacobson et al. issued on Oct. 11, 2005 and which is incorporated herein by reference.

The herein disclosed aspect of the present invention to implement a binary or n-state switch with bio-materials that may have recognition, modifying, generating and/or modulating properties. There is a broad field of Biomolecular or DNA computing that is concerned with computation problems. The area of creating basic biomolecular n-state switches that can be used to implement specific n-state functions appears to be limited. One example of implementing binary logic functions such as OR, AND and NAND in DNA sequences is provided by U.S. Patent Application Publication 20060051838 to Hwa et al. published on Mar. 9, 2006. However its approach is different from aspects provided herein.

A Kit for Independent State Logic Representation

Implementing an n-valued or a binary logic function by using state representation by independent instances of a logic state is unknown to most people. Accordingly it would be useful to provide embodiments that will assist persons to learn about logic. Accordingly a series of embodiments are provided that will demonstrate n-valued logic and binary logic implementation and allow persons to build n-valued and binary circuitry.

An exemplary embodiment in 3-valued or ternary logic and one in binary logic will be provided. It should be clear that such embodiments can also be provided in 4-valued and any other n-valued logic, including binary logic, which are fully contemplated.

As a further illustrative examples embodiments will be provided that will represent logic states as light in the visible spectrum. The advantage is that this will provide a directly visible and also decorative representation that allows a person to directly observe logic states and logic state changes.

Figure 15:
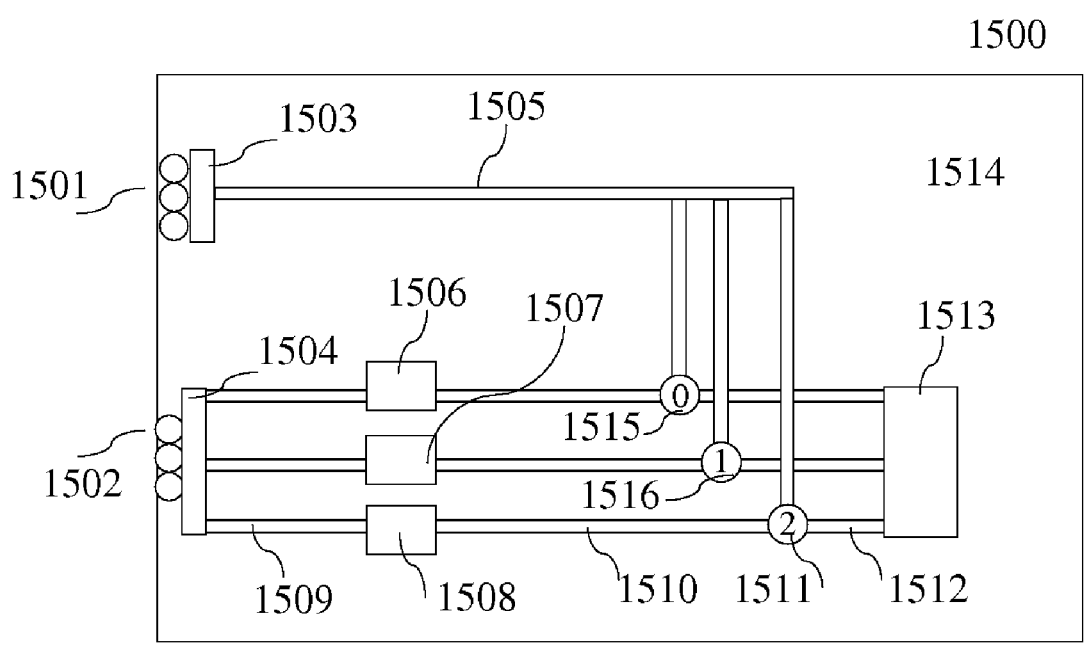
FIG. 15 is a diagram of a device implementing an n-valued logic function in accordance with an aspect of the present invention.

As a first example an assembled ternary logic kit is provided, which shows the working of a single ternary logic function. A diagram of one assembled kit 1500 is shown in FIG. 15. The kit comprises light sources 1501 and 1502. In this case a source is a ternary source. Absence of signal will not represent a state in this example. Accordingly the sources 1501 and 1502 may comprise three different light sources such as a red, a green and a blue LED. The source 1501 provides the control signal for ternary switches 1515, 1516 and 1511. The source 1501, enabled to provide signals having one of 3 colors is guided into a waveguide 1505 by a combiner 1503. The waveguide 1505 is preferably an optical fiber that can conduct red, blue and green light. All other optical connections are also assumed to be optical fiber in this illustrative example. Further more as another aspect of the present invention the fibers may be provide substantial light scattering or dispersion, as to illuminate the whole fiber and make the light path visible. Certainly in an assembled kit that is relatively small the loss due to scattering still leaves enough light power to be detected at the end of the fiber.

The source 1502 which can also provide three different states in red, blue and green colors is entered by combiner and splitter 1504 in 3 different channels with inverters 1506, 1507 and 1508. An inverter can be a reversible inverter; it can also be a not reversible inverter. An inverter can also be an identity inverter, which is of course not an inverter as it passes the states unmodified. Each channel receives the same color light from source 1502, however it may invert the incoming light color into a different color light. After leaving the inverter the light will come to a switch. In general only one of the three switches will be enabled to let pass the light. This depends on the state of the control signal coming from source 1501.

Assume for the present example that the signal provided by 1501 represents state 2. Accordingly switch 1511 will be conducting and 1515 and 1516 will be non-conducting. The signal conducted by 1511 will reach final state display 1513 which may be a detector and has for instance three LEDS of which one will represent the state of the signal provided on the output of switch 1511.

Switches 1511, 1515 and 1516 may be MEMS switches which conduct light from input to output. Switches 1511, 1515 and 1516 may also be composite switches as explained in for instance FIG. 8 wherein light detected by a detector enables a generator, in this case generating the same light color. One may combine inverter 1506 and switch 1515 to save components to obtain the same input/output configuration of the channel with this switch. The same applies to inverter 1507 and switch 1516 and to inverter 1508 with switch 1511.

One may include with 1500 a power source such as a battery. One may also include a circuit which will step light sources 1501 and 1502 through all their states and may run autonomously. A timer may be included that times the stepping period and may be set by a user from very fast down to very slow. Further more switches may be provided that allow a user to set manually a state for 1501 and 1502. Such switches may be for instance touch sensitive membranes. They may also be push buttons or any other switch that would enable controlling a source of light. Further more a power switch may be provided that switches the assembled kit on or off.

Figure 16:
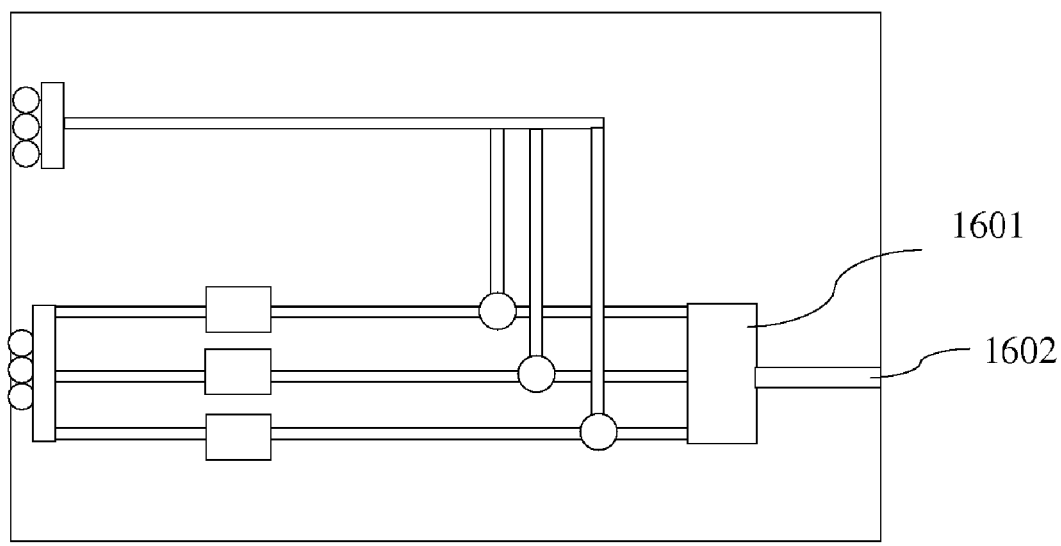
FIG. 16 is another diagram of a device implementing an n-valued logic function in accordance with an aspect of the present invention.

FIG. 16 provides as an aspect of the present invention an assembled kit wherein the signal that determines an output state for instance on a display 1601 is provided on an output 1602.

Figure 17:
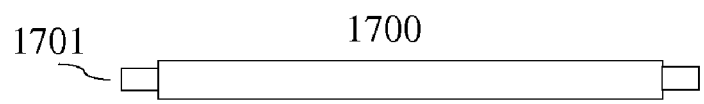
FIG. 17 is a diagram of a component of a kit for implementing n-valued logic in accordance with an aspect of the present invention.

FIG. 17 provides as an aspect of the present invention a connecting fiber that can be part of a kit with a body 1700 and a connecting end 1701. The connecting end 1701 can connect with output 1602 of FIG. 16.

Figure 18:
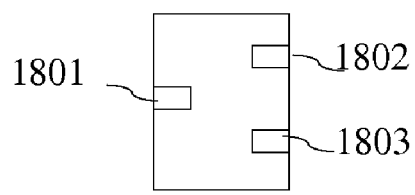
FIG. 18 is a diagram of another component of a kit for implementing n-valued logic in accordance with an aspect of the present invention.

An optical connector that can be part of a kit is provided as an aspect of the present invention in FIG. 18. The optical connector has an input 1801. It has at least one output 1802. An output 1803 is also shown. Outputs 1802 and 1803 provide the same signal as if they are connected to input 1801 by a splitter, which is not shown but present. The connector may also have more outputs that are all connected to the input.

Figure 19:
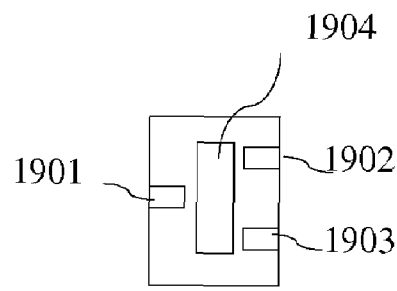
FIG. 19 is a diagram of yet another component of a kit for implementing n-valued logic in accordance with an aspect of the present invention.

FIG. 19 is a diagram of a connector that is an active variant of FIG. 18. The connector as provided as an aspect of the present invention in FIG. 19 also has an input 1901 and two outputs 1902 and 1903. However in addition it has a repeater 1904. This repeater detects a signal and provides a refreshed signal in the same state to an output.

Figure 20:
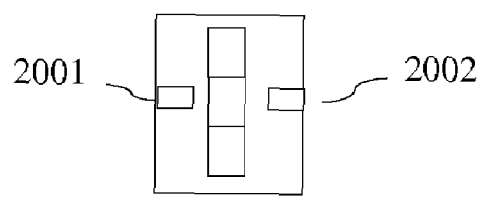
FIG. 20 is a diagram of yet another component of a kit for implementing n-valued logic in accordance with an aspect of the present invention.

Also provided as an aspect of the present invention is a series of ternary inverters as shown in diagram in FIG. 20. An inverter has at least one input 2001 and an output 2002. An inverter can receive on an input an optical signal being red, blue or green. The inverter changes the output according to a ternary inverter and provides an optical signal in one of the colors red, blue or green on at least one output 2002. An inverter may perform for example the inversion [red blue green] to [blue green red]. So if the input was red the output is blue; if the input was blue, the output is green; and if the input was green the output is red. An inverter may realize any ternary state conversion. Included in an inverter may be a power source. The inverter as shown in FIG. 20 may also be provided with means to configure a conversion from input to output, so that with one type of inverter device any ternary inverter may be configured and implemented.

Figure 21:
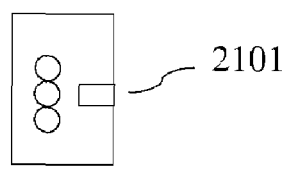
FIG. 21 is a diagram of yet another component of a kit for implementing n-valued logic in accordance with an aspect of the present invention.

Also provided as an aspect of the present invention is a signal source. A diagram is shown in FIG. 21. A source can generate one of 3 optical signals: red, blue or green. Lights of other colors and wavelengths are possible and fully contemplated. Also combinations and mixtures of colors are possible. These combinations may provide attractive colors for demonstration purposes. One should be careful to create mixtures or combinations that can be detected and sufficiently distinguished from other combinations. For instance white light may represent a state if individual states of red, blue and green do not occur at the same time. A state may be represented by red light. A state may be represented by green light. A state may be represented by blue light. A state may be represented by white light. A state may be represented by infrared light. A state may be represented by ultraviolet light. A state may be represented by any instance of radiation that is distinguishable from another instance of radiation, for instance in wavelength, or in charge or in energy.

Figure 22:
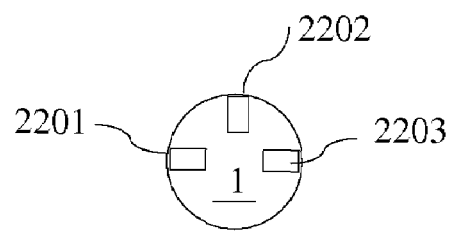
FIG. 22 is a diagram of yet another component of a kit for implementing n-valued logic in accordance with an aspect of the present invention.

The source signal is outputted on at least one output 2101. More outputs may be provided. Included in a source may be a power source. Further the source is provided with a switch or selector that allows a user to select a signal with a preferred state. The Also provided as an aspect of the present invention is a gate that implements a ternary switch which will connect an input with the output when a control input is in one of three states and wherein the output is disconnected from the input if the control input is not in the one of three states. This is shown in FIG. 22 with input 2201 and output 2203 and control input 2202. It is again understood that conducting from input to output means that the output assumes the state of the input. In this case the diagram of the switch has the symbol 1 underlined which means that the switch is conducting for state 1, which is when the signal on the control input is 1. The switch may be provided with a power source and a switch to switch the switch on or off. A switch may be provided for each conducting situation for a control signal. This may include a switch is non-conducting when the control input is 1 and all other possible combinations of conductance and input signals. The switch may also be enabled to configure each conducting condition.

Figure 23:
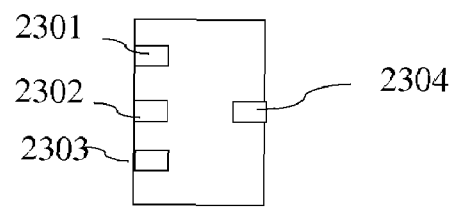
FIG. 23 is a diagram of yet another component of a kit for implementing n-valued logic in accordance with an aspect of the present invention.

Also provided as an aspect of the present invention is a display that displays a detected state. A diagram of such a display is shown in FIG. 23. The display has as least one input. However it may be used with more than one channel of which only one is active. Accordingly a display may also have more inputs. FIG. 23 shows three inputs: 2301, 2302 and 2303. The display detects the active state of the input and displays that state. This may for instance be done by activating one or more LEDs of the color representing the active state. The display may pass on the state on an output 2304. In case more than 1 input is activated the display may select one (for instance input 2301) as a preferred input and display the state of that input. The display may be provided with a power source and a switch to switch on or off the display.

Figure 24:
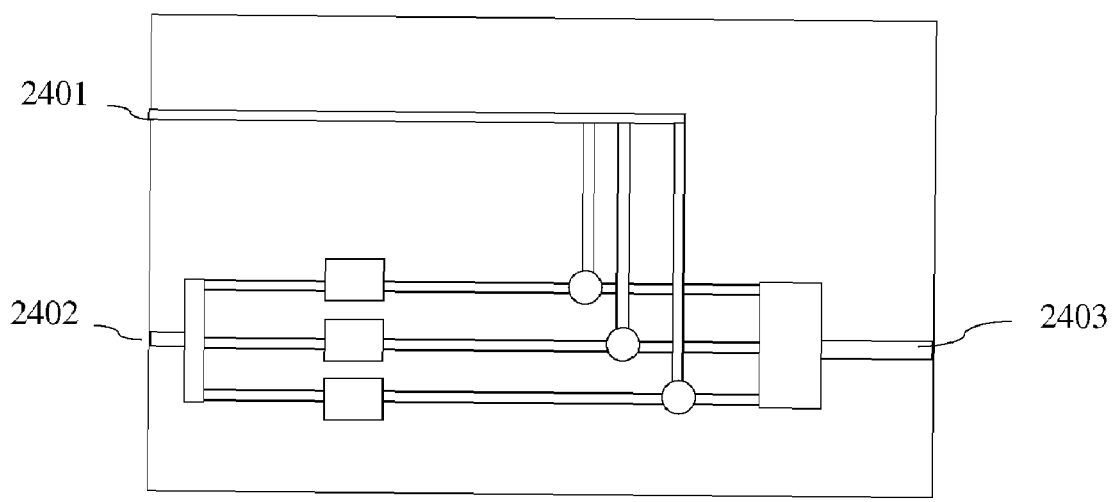
FIG. 24 is a diagram of a device implementing a ternary logic function in accordance with an aspect of the present invention.

Also provided as an aspect of the present invention is a complete circuit realizing a ternary logic function as shown in diagram in FIG. 24. The circuit has a control input 2401, an input 2402 and at least one output 2403 for optical signals. The circuit implements a complete ternary 2 input single output logic function. The circuit may comprise a display, it may also not comprise a display. The circuit of FIG. 24 may include a power source and a switch to switch the circuit on or off. As explained before the circuit may require inverters and ternary switches. These may be pre-configured. They may also be configurable.

Further more a manual explaining the kit and/or multi-valued logic is provided. Binary logic may also be explained. Examples to implement or experiment with the kit having one or more of the components here provided may also be included. Packaging for the kit may also be provided.

Figure 25:
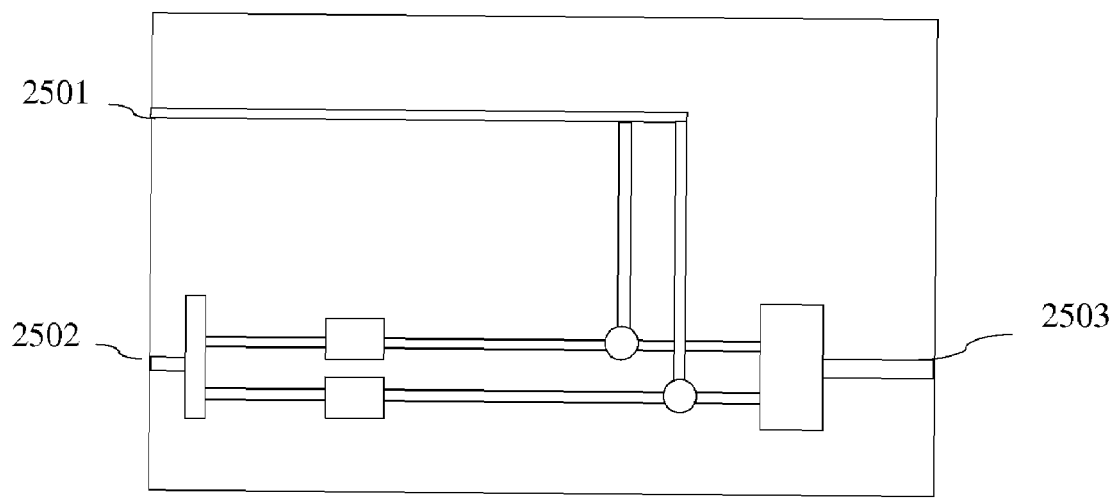
FIG. 25 is a diagram of a device implementing a binary logic function in accordance with an aspect of the present invention.

The kit is explained for ternary logic. A binary logic kit having states represented by a color of an optical signal is also provided as an aspect of the present invention. For instance FIG. 25 shows an example of a implementing a binary logic function wherein for instance a 0 is red light and a 1 is blue light. In general binary logic in standard electronic form does not work with inverters and binary gates as provided here. This is because the state 0 is generally represented as absence of signal, which requires the output of a circuit to be non-floating. The binary implementation as provided here uses 4 different inverters [0 0], [0 1], [1 0] and [1 1]. With binary switches that may conduct from input output when a control input is in one of two states and the binary inverters all 16 possible binary logic functions can be realized in optical form.

For instance the binary NAND function is determined by the following truth table.

| NAND | 0 | 1 |
| --- | --- | --- |
| 0 | 1 | 1 |
| 1 | 1 | 0 |

Accordingly when 0 is a first color optical signal for instance red and 1 is a second color optical signal for instance blue, then the NAND can be implemented by a device as shown in diagram in FIG. 25 with two channels. A first channel having an inverter [1 1] and the first channel being enabled by a binary switch when the control input of a first switch is in state 0; and a second channel having an inverter [1 0], the second channel being enabled when the control input of a second switch is in state 1.

Notwithstanding the ability to enable a state in an n-valued with n≧2 circuit by enabling a channel with a switch applying a control input, any n-valued state can be realized by enabling a source generating a signal representing an n-valued state. Such enabling may involve making conducting from input to output one or more switches each being controlled by a control input. Accordingly a kit using that approach may only use sources, switches and connectors for realizing states and no inverters.

Also provided as an aspect of the present invention is a board for putting on or placing or holding elements of the kit. Such a board may have fixtures such as Velcro, magnets or other means to hold components of the kit on the board.

In accordance with an aspect of the present invention a state may be represented by red light. A state may also be represented by blue light. A state may also be represented by green light. A state may also be represented by ultra-violet light. A state may also be represented by infra-red light. A state may also be represented by any wavelength light that can be detected.

In one embodiment a kit may be used to demonstrate and show the signal flow of signals. Accordingly in such an embodiment all components are large enough to be viewed and to watch the flow of signals without special means. As such it may be used as a decorative piece.

In a second embodiment a kit may be used to demonstrate or test a viability of a logic circuit, perhaps as part of a larger circuit or project. Circuits as implemented in such a kit may be simulated in a computer program and showing the circuit and signal flow may not be important. In such a case a small size may be preferred. Such a kit may have its components designed and implemented as for instance standard blocks to be placed in a micro-electronic type of implementation and realized in a very small integrated electro optical or optical circuit or any other type of circuit. Those embodiments and any variation thereof are fully contemplated.

As an illustrative example optical signals of different wavelengths are used as non-magnitude representation of logic states. It should be clear that other phenomena can also be used and are fully contemplated, including using signals with different frequencies or using molecules such as proteins or RNA to represent a state.

One may implement input, control and output signals to a switch, inverter or any other component as being instances of a similar phenomenon. That is: all those signals may be for instance optical signals or signals represented by a material. As described before a signal has to be detected by a detector, or a signal has to be generated. Accordingly a signal may be detected as one phenomenon and may be generated as another phenomenon. For instance a signal may be detected as an optical input signal in an inverter and generated as an electrical signal on an output. Or it may be detected as a presence of a material on an input and provided as an electrical signal on an output. Any combination of phenomena is fully contemplated as an aspect of the present invention.

In general an explanation of binary logic circuits using binary on/off switches is frowned upon because it is not how an electronic circuit may be implemented. However in the context of n-valued logic such an explanation is desirable because it makes understanding n-valued implementations easier.

While the illustrative example is provided for binary and ternary logic, a kit and its components may be provided in any value of $n \geq 2$ which is fully and expressly contemplated.

Combinational binary and n-valued circuits can be created using switches and inverters. Herein an input is not dependent from an output. This allows creating any binary and n-valued switching function. Accordingly one can create any composite computing device using combinational circuits. However to store information one needs memory devices such as latches, which are sequential devices. The inventor has disclosed binary and n-valued logic based information retaining devices in U.S. patent application Ser. No. 11/448,404 filed Jun. 7, 2006 and in U.S. patent application Ser. No. 11/139,835 filed on May 27, 2005 which are both incorporated herein by reference in their entirety.

Figure 26:
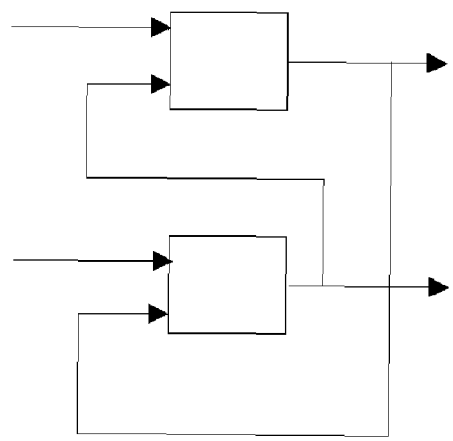
FIG. 26 is a diagram of a device implementing a n-valued logic function based information retaining device in accordance with an aspect of the present invention.
Figure 27:
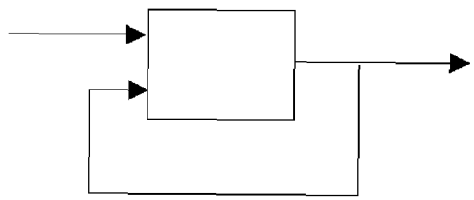
FIG. 27 is a diagram of another device implementing a n-valued logic function based information retaining device in accordance with an aspect of the present invention.
Figure 28:
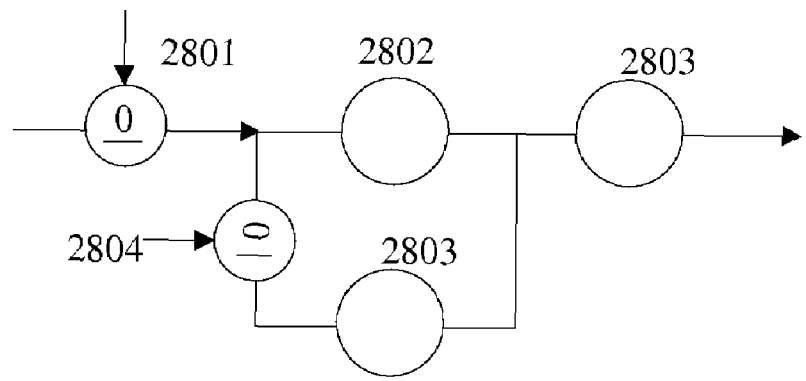
FIG. 28 is a diagram of yet another device implementing a n-valued logic function based information retaining device in accordance with an aspect of the present invention.

It has been shown how binary and n-valued functions can be created using independent instances of a phenomenon. One can use these functions to create information retaining devices. One example is shown in diagram in FIG. 26 using two devices 2601 and 2602 with feedback, each device implementing an n-valued logic function. FIG. 27 shows a single device 2701 implementing an n-valued function with feedback. FIG. 28 shows two n-valued inverters 2802 and 2803 with feedback. Inverter 2803 is enabled when in this example the control input of switch 2804 is not in state 0. In that case switch 2801 is disabled and no output signal is provided on the output of switch 2801. Inverters 2802 and 2803 combined create identity and the appropriate signal goes round and round until the control signal becomes 0. An additional inverter 2803 is provided at the output to make sure one gets an un-inverted state. Other combinations of inverters with feedback are possible and are fully contemplated. The cited patent application Ser. No. 11/448,404 provides appropriate n-valued functions and inverters for realizing sequential circuits such as memory circuits.

In accordance with another aspect of the present invention a circuit is provided that provides a pulse or a train of pulses at regular intervals that can serve as a clock signal. Such a clock signal can be used to enable and disable circuits at regular intervals. It can also be used to enable or disable gates to let pass signals or stop signals from passing.

Accordingly one can create sequential and combinatorial n-valued circuits. To one of ordinary skill in the art it should be clear that one can create an n-valued memory for storing data and instructions and one can create a CPU for executing instructions and process data. In accordance with an aspect of the present invention computing devices are provided using a switch and/or inverter as disclosed herein. Computer devices in accordance with a further aspect of the present invention include a computer, a control circuit, a calculator, a coder, audio and video recording and playing circuits, a communication circuit or any digital circuit that requires processing data and executing instructions.

In summary: An n-valued switch with $n \geq 2$ is provided with an input, an output and a control input. If the control input is in a certain state then an output signal is generated at the output. Signals at input, control input and output may be instances of different physical phenomena; however they can be instances of the same physical phenomenon. An instance of a phenomenon represents a logic state. Inverters are also provided. An inverter has an input and an output. A signal on the input may be of a different phenomenon than a signal on the output; however they also may be instances of the same phenomenon. An inverter when it has a signal at an input will create a state which may be represented by a signal or by absence of signal at the output. A kit using an n-valued switch is also provided. A computer device which includes an n-valued switch is also provided.

An independent instance of a characteristic of a physical phenomenon in the context of a switch or an inverter means that combining in one input a first and a second independent instance of the characteristic of the physical phenomenon will not create a third instance of the characteristic of the physical phenomenon at that input. For instance in an apparatus red light added to blue light at an input will not generate light with a third wavelength at that input and accordingly each signal (red and blue light) is an independent instance (red and blue) of a characteristic (wavelength) of a physical phenomenon (light). However light of wavelength $\lambda 1$ with an intensity A coherent with light also of wavelength $\lambda 1$ with intensity B both inputted on the same input may cause a signal of intensity A+B to be detected.

In general inputs of an apparatus may receive signals from a similar physical phenomenon (such as light, or an electrical signal). In accordance with a further aspect of the present invention such a limitation is not required and each input may receive a signal from a different phenomenon or they may be identical phenomena. For instance a first and a second input may both be enabled to receive and detect and optical signal. However the first input may also be able to receive an electrical signal and the second input may be enabled to receive an optical signal. An output may for instance be enabled to provide a signal of a third phenomenon, for instance a material. The output may for instance also be enabled to provide an optical signal or an electrical signal. Accordingly inputs and outputs may be associated with identical phenomena with a characteristic with independent instances. They may also be associated with different phenomena.

In accordance with a further aspect of the present invention one may also apply magnitude based and non-magnitude based instances of one or more phenomena to implement an n-state switch or an n-state inverter. For instance one may assign a magnitude based instance of a phenomenon to one or more inputs and/or outputs, while keeping the remaining terminals (which may include inputs and/or outputs) assigned to a non-magnitude based instance of a phenomenon.

While there have been shown, described and pointed out fundamental novel features of the invention as applied to preferred embodiments thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto.

The following patent applications, including the specifications, claims and drawings, are hereby incorporated by reference herein, as if they were fully set forth herein: (1) U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS; (2) U.S. Non-Provisional patent application Ser. No. 10/936,181, filed Sep. 8, 2004, entitled TERNARY AND HIGHER MULTI-VALUE SCRAMBLERS/DESCRAMBLERS; (3) U.S. Non-Provisional patent application Ser. No. 10/912,954, filed Aug. 6, 2004, entitled TERNARY AND HIGHER MULTI-VALUE SCRAMBLERS/DESCRAMBLERS; (4) U.S. Non-Provisional patent application Ser. No. 11/042,645, filed Jan. 25, 2005, entitled MULTI-VALUED SCRAMBLING AND DESCRAMBLING OF DIGITAL DATA ON OPTICAL DISKS AND OTHER STORAGE MEDIA; (5) U.S. Non-Provisional patent application Ser. No. 11/000,218, filed Nov. 30, 2004, entitled SINGLE AND COMPOSITE BINARY AND MULTI-VALUED LOGIC FUNCTIONS FROM GATES AND INVERTERS; (6) U.S. Non-Provisional patent application Ser. No. 11/065,836 filed Feb. 25, 2005, entitled GENERATION AND DETECTION OF NON-BINARY DIGITAL SEQUENCES; (7) U.S. Non-Provisional patent application Ser. No. 11/139,835 filed May 27, 2005, entitled MULTI-VALUED DIGITAL INFORMATION RETAINING ELEMENTS AND MEMORY DEVICES.

What is claimed is:

1. An n-state switch with $n \geq 2$, comprising:
a first input enabled to receive a first signal representing a first of n states, the signal being an independent instance of a characteristic of a first physical phenomenon;
a second input enabled to receive a second signal representing a second of n states, the second signal being an independent instance of a characteristic of a second physical phenomenon; and
an output enabled to provide an output signal representing a state whenever the first input receives the first signal and the second input receives the second signal.

2. The n-state switch as claimed in claim 1, further comprising:
the output providing not a signal whenever the second input does not receive the second signal.

3. The n-state switch as claimed in claim 1, wherein n>2.

4. The n-state switch as claimed in claim 1, wherein an absence of signal represents a state.

5. The n-state switch as claimed in claim 1, wherein the first and the second physical phenomenon are the same physical phenomenon.

6. The n-state switch as claimed in claim 1, wherein the first and the second physical phenomenon are not the same physical phenomenon.

7. The n-state switch as claimed in claim 1, wherein the output provides an output signal representing the state of the first signal whenever the second input receives the second signal.

8. The n-state switch as claimed in claim 1, wherein the output provides an output signal representing the state of the first signal whenever the second input does not receive the second signal.

9. The n-state switch as claimed in claim 1, further comprising:
an additional input enabled to receive a third signal representing a third of n states, the third signal being an independent instance of a characteristic of a physical phenomenon; and
the output being enabled to provide an output signal representing a state whenever the first input receives the first signal, the second input receives the second signal, and the additional input receives the third signal.

10. The n-state switch as claimed in claim 9, wherein the state of the output signal when provided on the output represents the first signal.

11. The n-state switch as claimed in claim 1, wherein the n-state switch is connected to an n-state inverter having an input and an output.

12. The n-state switch as claimed in claim 11, wherein the n-state inverter includes a detector for a first signal on the input and a generator for a second signal on the output.

13. The n-state switch as claimed in claim 1, wherein the switch is part of a device which implements an n-valued logic function.

14. The n-state switch as claimed in claim 1, wherein a state is represented by a wavelength of a signal.

15. The n-state switch as claimed in claim 1, wherein a state is represented by a presence of a material.

16. The n-state switch as claimed in claim 1, wherein a state is represented by a material from a group consisting of a cell, a virus, an antibody, a chemical, a protein, a peptide, a nucleic acid, an oligosaccharides, a nucleotide, a metabolite, an ion, a carbohydrate, a polysaccharide, a hormone, an antigen, an enzyme, an RNA or a DNA molecule.

17. The n-state switch as claimed in claim 1, wherein the n-state switch is part of a computing device.

18. The n-state switch as claimed in claim 1, wherein the n-state switch is part of a kit.

19. A kit for implementing an n-state logic device with $n \geq 2$, comprising a switch, the switch including:
a first input enabled to receive a first input signal having one of n states, a state being represented by an independent instance of a characteristic of a first physical phenomenon;
a second input enabled to receive a second signal having one of n states, a state being represented by an independent instance of a characteristic of a second physical phenomenon; and
an output enabled to provide an output signal representing the first input signal whenever the second signal has a first state.

20. The kit as claimed in claim 19, wherein n>2.

21. The kit as claimed in claim 19, wherein the first and the second signal are optical signals.

22. The kit as claimed in claim 19, further comprising an inverter with an input and an output, including a detector for detecting a first signal on the input and a generator for generating a second signal on the output.

23. The kit as claimed in claim 19, wherein the kit implements an n-valued logic function.

24. An n-state switch with $n \geq 2$, comprising:
- a first input enabled to receive a first signal being an independent instance of a characteristic of a first physical phenomenon and representing one of n states;
- a second input enabled to receive a second signal, the second signal being an independent instance of a characteristic of a second physical phenomenon and representing one of n states; and
- an output enabled to provide an output signal representing the first signal whenever the first input receives the first signal and the second input receives the second signal being in a first of n states.

25. The n-state switch as claimed in claim 24, wherein the first and the second physical phenomenon are identical.

* * * * *